(12) United States Patent
Hanada et al.

(10) Patent No.: US 12,713,659 B2
(45) Date of Patent: Aug. 18, 2026

(54) SEMICONDUCTOR DEVICE

(71) Applicant: Magnolia White Corporation, Tokyo (JP)

(72) Inventors: Akihiro Hanada, Tokyo (JP); Hajime Watakabe, Tokyo (JP); Ryo Onodera, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 420 days.

(21) Appl. No.: 18/447,470

(22) Filed: Aug. 10, 2023

(65) Prior Publication Data

US 2023/0387320 A1 Nov. 30, 2023

Related U.S. Application Data

(63) Continuation of application No. PCT/JP2021/047591, filed on Dec. 22, 2021.

(30) Foreign Application Priority Data

Feb. 18, 2021 (JP) ................................ 2021-024485

(51) Int. Cl.
*H10D 30/67* (2025.01)
*H10D 62/60* (2025.01)

(52) U.S. Cl.
CPC ......... *H10D 30/6755* (2025.01); *H10D 62/60* (2025.01)

(58) Field of Classification Search
CPC ... H10D 30/6755; H10D 86/423; H10D 62/60
See application file for complete search history.

(56) References Cited

U.S. PATENT DOCUMENTS 6,624,864 B1 9/2003 Kubo et al.
6,888,160 B1 5/2005 Nakajima et al.
(Continued)

FOREIGN PATENT DOCUMENTS

JP 11-112002 A 4/1999
JP 2000-002892 A 1/2000
(Continued)

OTHER PUBLICATIONS

International Search Report issued on Feb. 22, 2022 in corresponding application No. PCT/JP2021/047591; 5 pages.
(Continued)

*Primary Examiner* — Vincent Wall
(74) *Attorney, Agent, or Firm* — Maier & Maier, PLLC

(57) ABSTRACT

A semiconductor device includes a first conductive layer, a first insulating layer on the first conductive layer, an oxide semiconductor layer on the first insulating layer, and second and third conductive layers on the oxide semiconductive layer. The oxide semiconductor layer includes a first region, a second region in contact with the second conductive layer, a third region in contact with the third conductive layer, a first impurity region between the first region and the second region, and a second impurity region between the first region and the third region. The first impurity region is in contact with the second conductive layer. The second impurity region is in contact with the third conductive layer. An electrical conductivity of each of the first impurity region and the second impurity region is greater than an electrical conductivity of each of the second region and the third region.

12 Claims, 25 Drawing Sheets

(56) References Cited

U.S. PATENT DOCUMENTS

2010/0207117 A1* 8/2010 Sakata ............... H10D 30/6755
257/E21.414
2015/0187878 A1* 7/2015 Yamazaki ............ H10D 86/423
257/43
2020/0052100 A1 2/2020 Koezuka et al.

FOREIGN PATENT DOCUMENTS

JP 2015-144250 A 8/2015
JP 2020-027942 A 2/2020

OTHER PUBLICATIONS

English machine translation of Office Action dated Feb. 17, 2026, issued in JP Appl. No. 2023-500588, 3 pages.

* cited by examiner

SEMICONDUCTOR DEVICE

CROSS-REFERENCE TO RELATED APPLICATIONS

This application is a Continuation of International Patent Application No. PCT/JP2021/047591, filed on Dec. 22, 2021, which claims the benefit of priority to Japanese Patent Application No. 2021-024485, filed on Feb. 18, 2021, the entire contents of which are incorporated herein by reference.

FIELD

An embodiment of the present invention relates to a semiconductor device including a transistor. Further, an embodiment of the present invention relates to a method for manufacturing a semiconductor device.

BACKGROUND

In recent years, an oxide semiconductor has attracted attention as a semiconductor for an organic light emitting diode display (OLED display device). Since a transistor in which the oxide semiconductor is used for a semiconductor layer (a transistor with an oxide semiconductor layer) has low off-leakage current and is capable of being driven at low frequency, it is possible to achieve a display device with low power consumption. In particular, when the transistor with the oxide semiconductor layer is applied to the OLED display device which is a self-luminous-type display device, power consumption is more effectively reduced.

Since the oxide semiconductor has high insulating properties, it is preferable that regions in contact with a source electrode and a drain electrode have low resistance in the oxide semiconductor layer. For example, Japanese laid-open patent publication No. 2020-27942 discloses a top-gate transistor in which an impurity element is added into an oxide semiconductor layer using a gate electrode as a mask to form a low-resistance region in the oxide semiconductor layer.

SUMMARY

A semiconductor device according to an embodiment of the present invention includes a first conductive layer on an insulating surface, a first insulating layer on the first conductive layer, an oxide semiconductor layer on the first insulating layer, a second conductive layer on the oxide semiconductor layer, and a third conductive layer on the oxide semiconductive layer. The oxide semiconductor layer includes a first region, a second region in contact with the second conductive layer, a third region in contact with the third conductive layer, a first impurity region between the first region and the second region, and a second impurity region between the first region and the third region. The first impurity region is in contact with the second conductive layer. The second impurity region is in contact with the third conductive layer. An electrical conductivity of each of the first impurity region and the second impurity region is greater than an electrical conductivity of each of the second region and the third region.

Further, a semiconductor device according to an embodiment of the present invention includes a first conductive layer on an insulating surface, a first insulating layer on the first conductive layer, an oxide semiconductor layer on the first insulating layer, a second insulating layer on the oxide semiconductor layer, a second conductive layer on the second insulating layer, and a third conductive layer on the second insulating layer. The oxide semiconductor layer includes a first region in contact with the second insulating layer, a second region in contact with the second insulating layer and overlapping the second conductive layer, a third region in contact with the second insulating layer and overlapping the third conductive layer, a first impurity region between the first region and the second region, and a second impurity region between the first region and the third region. The first impurity region is in contact with the second conductive layer. The second impurity region is in contact with the third conductive layer. An electrical conductivity of each of the first impurity region and the second impurity region is greater than an electrical conductivity of each of the second region and the third region.

A method for manufacturing a semiconductor device according to an embodiment of the present invention includes the steps of forming a first conductive layer and a first connection electrode on an insulating surface, forming a first insulating layer on the first conductive layer and the first connection electrode, forming an oxide semiconductor layer on the first insulating layer so as to overlap the first conductive layer, forming a resist layer including a first opening and a second opening each of which overlaps the oxide semiconductor layer, forming a first impurity region and a second impurity region in the oxide semiconductor layer by adding an impurity element into the oxide semiconductor layer using the resist layer as a mask, forming a second conductive layer in contact with the first impurity region, and forming a third conductive layer in contact with the second impurity region. The first impurity region corresponds to the first opening and the second impurity region corresponds to the second opening.

A method for manufacturing a semiconductor device according to an embodiment of the present invention includes the steps of forming a first conductive layer and a first connection electrode on an insulating surface, forming a first insulating layer on the first conductive layer and the first connection electrode, forming an oxide semiconductor layer on the first insulating layer so as to overlap the first conductive layer, forming a second insulating layer on the oxide semiconductor layer and the first insulating layer, forming a resist layer including a first opening and a second opening each of which overlaps the oxide semiconductor layer, and forming a first impurity region and a second impurity region in the oxide semiconductor layer by adding an impurity element into the oxide semiconductor layer using the resist layer as a mask. The first impurity region corresponds to the first opening and the second impurity region corresponds to the second opening.

BRIEF DESCRIPTION OF DRAWINGS

FIG. 13 is a cross-sectional view of a pixel of a display device according to an embodiment of the invention.

DESCRIPTION OF EMBODIMENTS

Figure 1:
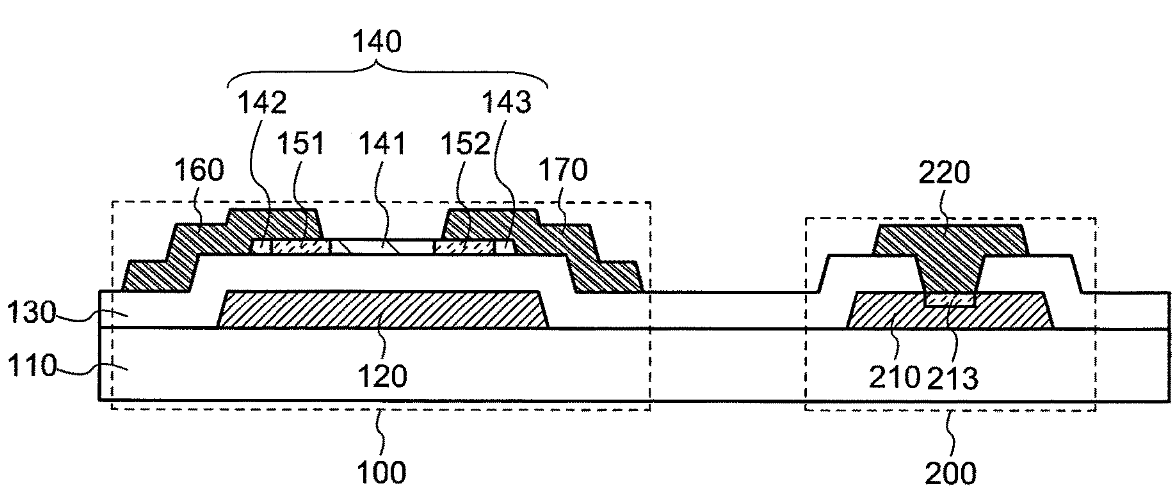
FIG. 1 is a schematic cross-sectional view of a semiconductor device according to an embodiment of the present invention.

A transistor operates even when an oxide semiconductor layer is not provided with the low-resistance region. However, in this case, since the negative bias temperature instability of the transistor is significant, there are problems such as a large shift of the threshold value in the positive direction. Therefore, the low-resistance region is preferably provided in the oxide semiconductor layer in the top-gate transistor. On the other hand, since the gate electrode is positioned below the oxide semiconductor layer in a bottom-gate transistor, impurities cannot be added into the oxide semiconductor layer using the gate electrode as a mask. In order to form the low-resistance region in the oxide semiconductor layer of the bottom-gate transistor, patterning to form another mask is required, which causes a problem of increasing cost and takt time in manufacturing a semiconductor device including the transistor.

In view of the above problems, an object of an embodiment of the present invention is to provide a semiconductor device with reduced cost and takt time and improved reliability, and a manufacturing method thereof.

Hereinafter, each of the embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "a includes A, B or C", "a includes any of A, B and C", and "a includes one selected from the group consisting of A, B and C" do not exclude the case where a includes a plurality of combinations of A to C unless otherwise specified. Further, these expressions do not exclude the case where a includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a structure over a substrate, one surface of the structure in the direction facing the substrate is the bottom surface of the structure and the other surface is the upper surface of the structure. In addition, the expression of a structure over a substrate only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers overlap in a plan view.

In the case when a single film is processed to form a plurality of structural bodies, each structural body may have different functions and roles, and the bases formed beneath each structural body may also be different. However, the plurality of structural bodies is derived from films formed in the same layer by the same process and have the same material. Therefore, the plurality of these films is defined as existing in the same layer.

First Embodiment

A semiconductor device 10 according to an embodiment of the present invention is described with reference to FIGS. 1 to 2D.

[1. Configuration of Semiconductor Device 10]

A configuration of the semiconductor device 10 according to an embodiment of the present invention is described with reference to FIG. 1.

FIG. 1 is a schematic cross-sectional view of the semiconductor device according to an embodiment of the invention. As shown in FIG. 1, the semiconductor device 10 includes a transistor 100 and a connection portion 200. The transistor 100 has a switching function, for example. The connection portion 200 electrically connects wirings provided in different layers, for example.

The transistor 100 includes a substrate 110, a first conductive layer 120, a first insulating layer 130, an oxide semiconductor layer 140, a second conductive layer 160, and a third conductive layer 170. The first conductive layer 120 is provided on the substrate 110. The first insulating layer 130 is provided on the first conductive layer 120 so as to cover the first conductive layer 120. The oxide semiconductor layer 140 is provided on the first insulating layer 130. Each of the second conductive layer 160 and the third conductive layer 170 is provided on the first insulating layer 130 and the oxide semiconductor layer 140. Each of second conductive layer 160 and third conductive layer 170 is electrically connected to the oxide semiconductor layer 140.

The substrate 110 has an insulating surface and can support each layer provided over the substrate 110. For example, a transparent rigid substrate such as a glass substrate, a quartz substrate, or a sapphire substrate can be used as the substrate 110. Further, a rigid substrate such as a silicon substrate that does not transmit light can be used as the substrate 110. Furthermore, a light-transmitting flexible substrate such as a polyimide resin substrate, an acrylic resin substrate, a siloxane resin substrate, or a fluororesin substrate can be used as the substrate 110. In order to improve the heat resistance of the substrate 110, impurities may be introduced into the resin substrate. A substrate in which a silicon oxide film or a silicon nitride film is formed over the rigid substrate or flexible substrate described above can also be used as the substrate 110.

The first conductive layer 120 can function as a gate electrode. For example, a metal such as aluminum (Al), titanium (Ti), molybdenum (Mo), copper (Cu), or tungsten (W), or an alloy thereof can be used as a material for the first conductive layer 120. Further, a transparent conductive oxide such as indium tin oxide (ITO) or zinc oxide (ZnO) can also be used as a material of the first conductive layer 120. The first conductive layer 120 may have a single-layer structure or a stacked-layer structure.

The first insulating layer 130 can function as a gate insulating layer. For example, silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), or the like can be used as a material for the first insulating layer 130. The first insulating layer 130 may have a single-layer structure or a stacked-layer structure. Here, silicon oxynitride ($SiO_xN_y$) and aluminum oxynitride ($AlO_xN_y$) are a silicon compound and an aluminum compound containing a smaller amount of nitrogen (N) than oxygen (O). On the other hand, silicon nitride oxide ($SiN_xO_y$) and aluminum nitride oxide ($AlN_xO_y$) are a silicon compound and an aluminum compound containing less oxygen than nitrogen. When the first insulating layer 130 has a stacked-layer structure, it is preferable that the first insulating layer 130 has a stacked-layer structure of an oxide layer and a nitride layer and the oxide layer is in contact with the oxide semiconductor layer 140.

The oxide semiconductor layer 140 can function as a channel formation region. For example, indium gallium zinc oxide (IGZO), indium tin zinc oxide (ITZO), indium aluminum zinc oxide (IAZO), or zinc oxide (ZnO) can be used as a material of the oxide semiconductor layer 140. Further, the oxide semiconductor layer 140 may have a single-layer structure or a stacked-layer structure.

The oxide semiconductor layer 140 includes a first region 141, a second region 142, a third region 143, a first impurity region 151, and a second impurity region 152. The first impurity region 151 is located between the first region 141 and the second region 142. The second impurity region 152 is located between the first region 141 and the third region 143. The first region 141 can function as the channel formation region. Each of the second region 142 and the third region 143 includes an end portion of the oxide semiconductor layer 140. Each of the first impurity region 151 and the second impurity region 152 can function as a low resistance region (a high concentration impurity region). Here, the low-resistance region means a region having a resistance lower than that of the channel formation region. In other words, the electrical conductivity of the low resistance region is greater than the electrical conductivity of the channel formation region.

Each of the first impurity region 151 and the second impurity region 152 contains an impurity element other than the material of oxide semiconductor layer 140. For example, the impurity element is boron (B), phosphorus (P), argon (Ar), hydrogen (H), or nitrogen (N). Further, each of the first impurity region 151 and the second impurity region 152 may contain aluminum (Al) as a trace inclusion. The electrical conductivity of each of first impurity region 151 and second impurity region 152 is greater than the electrical conductivity of each of the first region 141, the second region 142, and the third region 143. That is, each of the first impurity region 151 and the second impurity region 152 contains an impurity element, and thus has greater electrical conductivity than each of the first region 141, the second region 142, and the third region 143. The impurity elements contained in the first impurity region 151 and the second impurity region 152 do not have to generate carriers with respect to the material of the oxide semiconductor layer 140. The impurity element may generate oxygen vacancies in the material of the oxide semiconductor layer 140. In the first impurity region 151 and the second impurity region 152, the concentration of the impurity element is greater than or equal to $1\times10^{15}$ atoms/$cm^3$, and preferably greater than or equal to $1\times10^{16}$ atoms/$cm^3$.

The second conductive layer 160 and the third conductive layer 170 can function as a source electrode and a drain electrode, respectively. For example, a metal such as aluminum (Al), titanium (Ti), molybdenum (Mo), copper (Cu), or tungsten (W), or an alloy thereof can be used as a material for each of the second conductive layer 160 and the third conductive layer 170. Further, a transparent conductive oxide such as indium tin oxide (ITO) or zinc oxide (ZnO) can be used as the material for the second conductive layer 160 and the third conductive layer 170. Each of the second conductive layer 160 and the third conductive layer 170 may have a single-layer structure or a stacked-layer structure. In addition, even when the source electrode and the drain electrode are described in the specification, the function of the source electrode and the function of the drain electrode may be interchanged.

The second conductive layer 160 is electrically connected to the second region 142 and the first impurity region 151. The third conductive layer 170 is electrically connected to the third region 143 and the second impurity region 152. Since each of the first impurity region 151 and the second impurity region 152 can function as the low-resistance region, the connection between the second conductive layer 160 and the first impurity region 151 and the connection between the third conductive layer 170 and the second impurity region 152 are ohmic contact connections.

The connection portion 200 includes the substrate 110, a first connection electrode 210, the first insulating layer 130, and a second connection electrode 220. The first connection electrode 210 is provided on the substrate 110. The first insulating layer 130 is provided on the first connection electrode 210 so as to cover the first connection electrode 210. The second connection electrode 220 is provided on the first insulating layer 130. The second connection electrode 220 is electrically connected to the first connection electrode 210 through an opening provided in the first insulating layer 130.

For example, a metal such as aluminum (Al), titanium (Ti), molybdenum (Mo), copper (Cu), and tungsten (W), or an alloy thereof can be used as a material for the first connection electrode 210 and the second connection electrode 220. Further, the first connection electrode 210 and the second connection electrode 220 may have a single-layer structure or a stacked-layer structure. The first connection electrode 210 may be the same layer as the first conductive layer 120. That is, the first connection electrode 210 may be the same material or have the same structure as the first conductive layer 120. The second connection electrode 220 may be the same layer as the second conductive layer 160 and the third conductive layer 170. That is, the second connection electrode 220 may be the same material or have the same structure as the second conductive layer 160 and the third conductive layer 170.

The first connection electrode 210 includes a third impurity region 213. The third impurity region 213 contains an impurity element other than the material of the first connection electrode 210. For example, the impurity element is boron (B), phosphorus (P), argon (Ar), hydrogen (H), or nitrogen (N). Further, the third impurity region 213 may contain aluminum (Al) as a trace inclusion. The impurity element contained in the third impurity region 213 may be the same as the impurity element contained in the first impurity region 151 and the second impurity region 152. A concentration of the impurity element in the third impurity region 213 is not particularly limited. For example, in the third impurity region 213, the concentration of the impurity element is greater than or equal to $1\times10^{15}$ atoms/$cm^3$, and preferably greater than or equal to $1\times10^{16}$ atoms/$cm^3$ or more. In addition, it can also be said that the second connection electrode 220 is in contact with the third impurity region 213 and is electrically connected to the third impurity region 213.

In the semiconductor device 10 according to the present embodiment, the first impurity region 151 and the second impurity region 152 having high electrical conductivity are provided in the oxide semiconductor layer 140 of the transistor 100. The second conductive layer 160 and the third conductive layer 170 that correspond to the source electrode and the drain electrode are electrically connected to the first impurity region 151 and the second impurity region 152, respectively. Therefore, the connection between the second conductive layer 160 and the first impurity region 151 and the connection between the third conductive layer 170 and the second impurity region 152 are ohmic contact connections, and the interface between the oxide semiconductor layer 140 and the second conductive layer 160 and the interface between the oxide semiconductor layer 140 and the third conductive layer 170 are stabilized. Therefore, the reliability of transistor 100 is improved. In particular, the negative bias temperature instability of the transistor 100 is improved.

[2. Manufacturing Method of Semiconductor Device 10]

A method for manufacturing the semiconductor device 10 according to an embodiment of the present invention is described with reference to FIGS. 2A to 2D.

Each of FIGS. 2A to 2D is a schematic cross-sectional view illustrating a method for manufacturing the semiconductor device 10 according to an embodiment of the present invention. The description of a process that is usually performed as a method for manufacturing a semiconductor device may be omitted below.

Figure 2A:
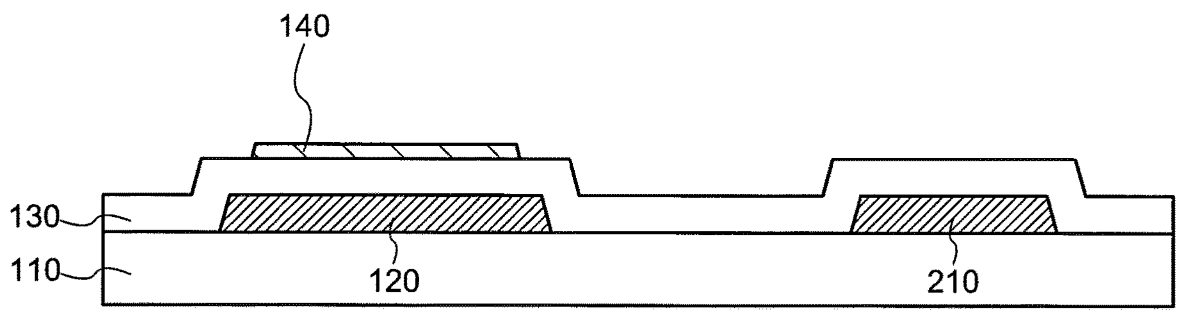
FIG. 2A is a schematic cross-sectional view illustrating a method for manufacturing a semiconductor device according to an embodiment of the present invention.

The first conductive layer 120, the first insulating layer 130, and the oxide semiconductor layer 140 are sequentially formed over the substrate 110 (see FIG. 2A). Each of the first conductive layer 120, the first insulating layer 130, and the oxide semiconductor layer 140 can be deposited using sputtering, CVD, or the like. Further, the patterns of the first conductive layer 120 and the oxide semiconductor layer 140 can be formed by photolithography.

Figure 2B:
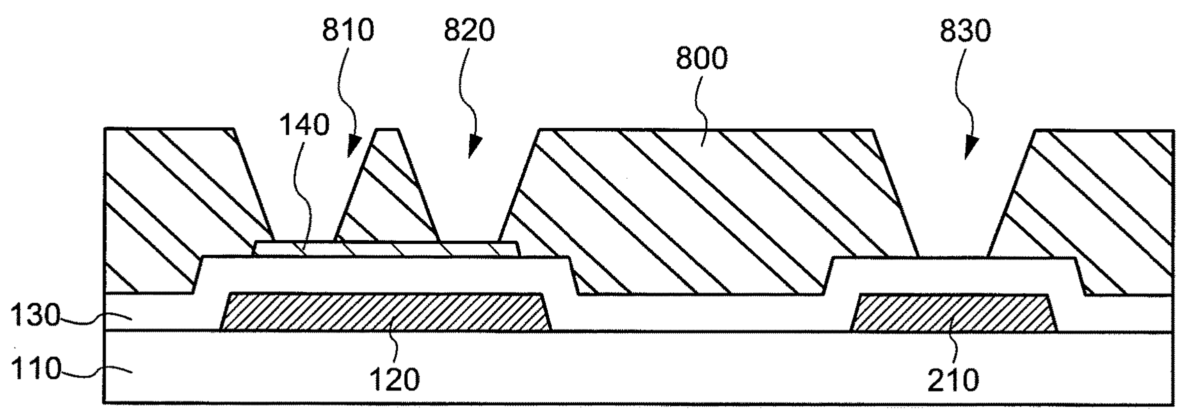
FIG. 2B is a schematic cross-sectional view illustrating a method for manufacturing a semiconductor device according to an embodiment of the present invention.

Then, a resist layer 800 that includes a first opening 810 and a second opening 820 overlapping the first conductive layer 120 and a third opening 830 overlapping the first connection electrode 210 are formed over the first insulating layer 130 and the oxide semiconductor layer 140 (see FIG. 2B). The first opening 810, the second opening 820, and the third opening 830 can be formed by a patterning process of photolithography.

Figure 2C:
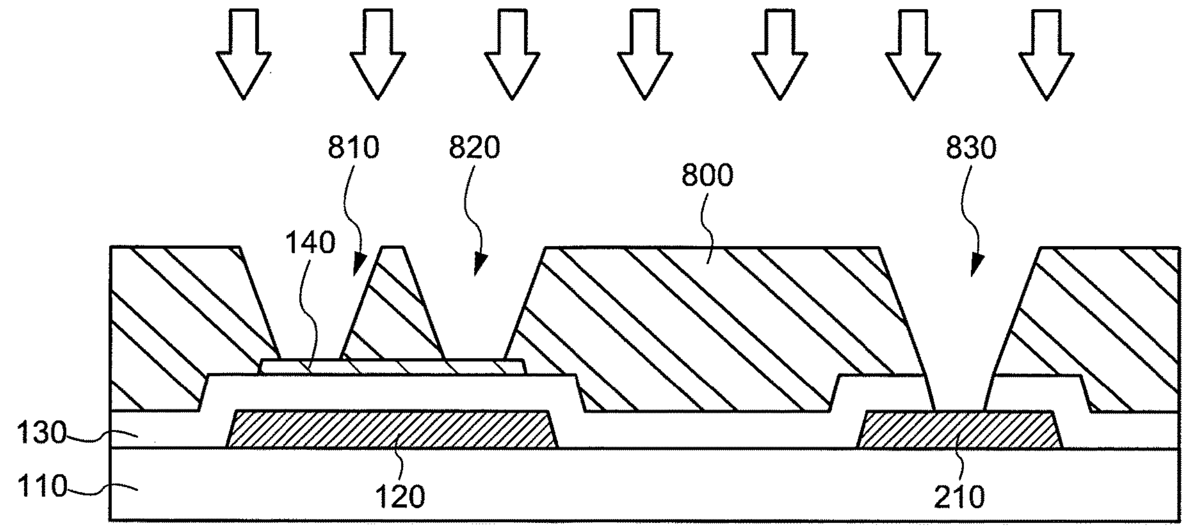
FIG. 2C is a schematic cross-sectional view illustrating a method for manufacturing a semiconductor device according to an embodiment of the present invention.

Then, the first insulating layer 130 is etched using the resist layer 800 as a mask (see FIG. 2C). Although the etching of the first insulating layer 130 can be performed by wet etching or dry etching, it is preferable that the etching is performed by dry etching, which can increase the selective ratio of etching between the first insulating layer 130 and the oxide semiconductor layer 140. For example, a fluorine-based gas can be used as a gas for such dry etching. Specifically, sulfur hexafluoride ($SF_6$), carbon tetrafluoride ($CF_4$), trifluoromethane ($CHF_3$), or the like can be used as a gas for dry etching. By using an etching gas with a high etching selectivity between the first insulating layer 130 and the oxide semiconductor layer 140, while the first insulating layer 130 exposed by the third opening 830 is etched (i.e., an opening is formed in the first insulating layer 130), the oxide semiconductor layer 140 exposed by the first opening 810 and the second opening 820 can be adjusted so that the oxide semiconductor layer 140 is hardly etched.

Figure 2D:
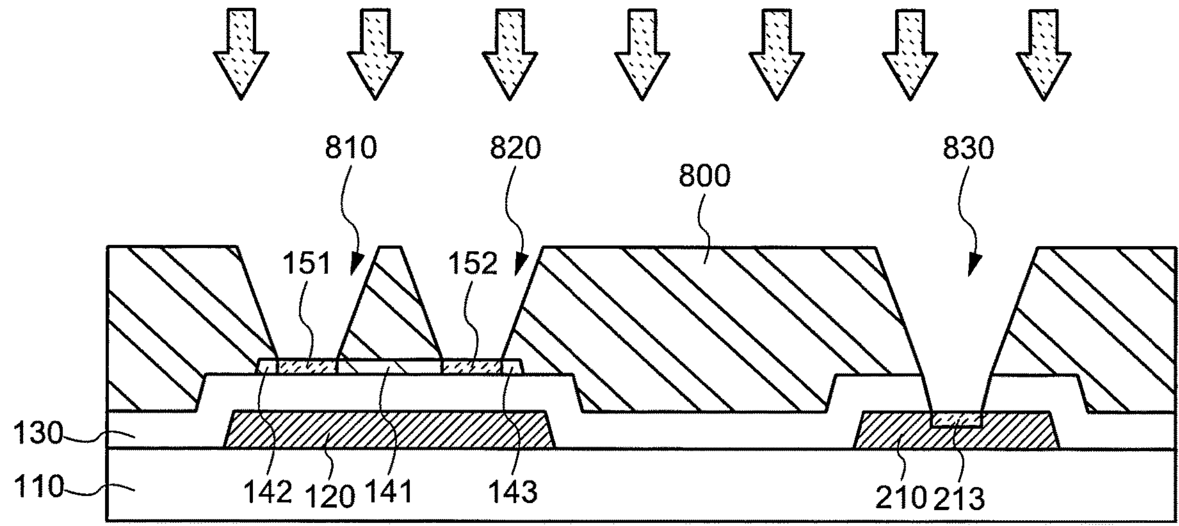
FIG. 2D is a schematic cross-sectional view illustrating a method for manufacturing a semiconductor device according to an embodiment of the present invention.

Then, an impurity element is added into the oxide semiconductor layer 140 using the resist layer 800 as a mask (see FIG. 2D). The addition of the impurity element can be performed using an ion implantation method or the like. The impurity element is added into the oxide semiconductor layer 140 through the first opening 810 and the second opening 820 to form the first impurity region 151 and the second impurity region 152 in the oxide semiconductor layer 140. Further, the impurity element is added into the first connection electrode 210 through the third opening 830 to form the third impurity region 213 in the first connection electrode 210.

Then, after removing the resist layer 800, the second conductive layer 160, the third conductive layer 170, and the second connection electrode 220 are formed, and the semiconductor device 10 shown in FIG. 1 can be manufactured.

In the method for manufacturing the semiconductor device 10 according to the present embodiment, the impurity element can be added into the oxide semiconductor layer 140 using the mask for forming the opening of the first insulating layer 130 in the connection portion 200. Therefore, it is not necessary to pattern a mask for adding the impurity element, and the cost and takt time in manufacturing the semiconductor device 10 can be reduced. Therefore, the semiconductor device 10 can be manufactured at low cost.

<Modification 1>

A semiconductor device 10A, which is a modification of the semiconductor device 10 according to an embodiment of the present invention, is described with reference to FIGS. 3A to 3C. In the description of the semiconductor device 10A, the description of the same configuration as the semiconductor device 10 may be omitted. In addition, the modification of the semiconductor device 10 is not limited to the semiconductor device 10A.

Figure 3A:
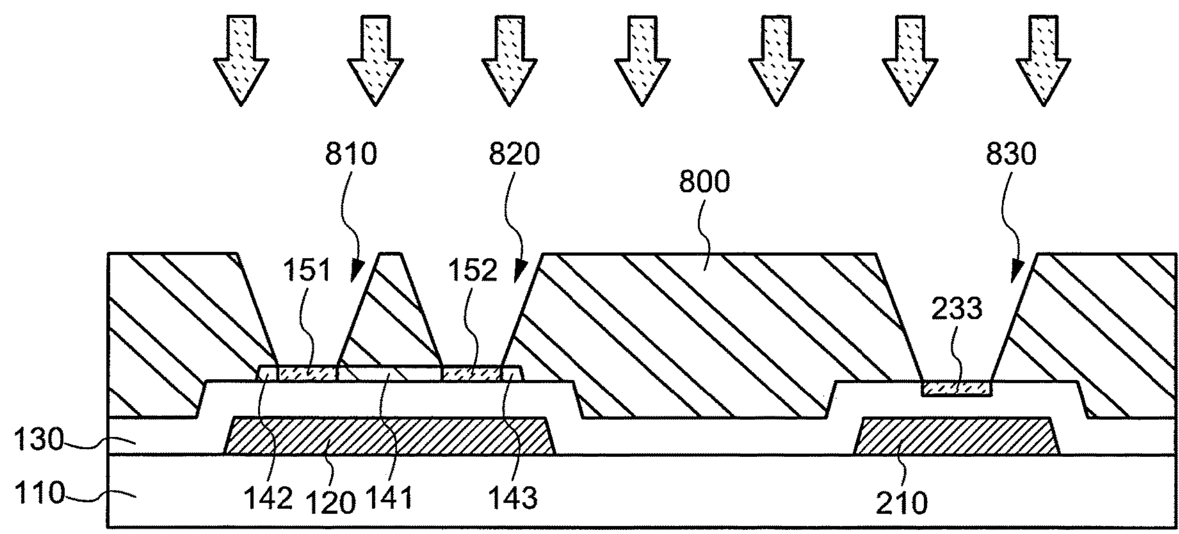
FIG. 3A is a schematic cross-sectional view illustrating a method for manufacturing a semiconductor device according to an embodiment of the present invention.
Figure 3B:
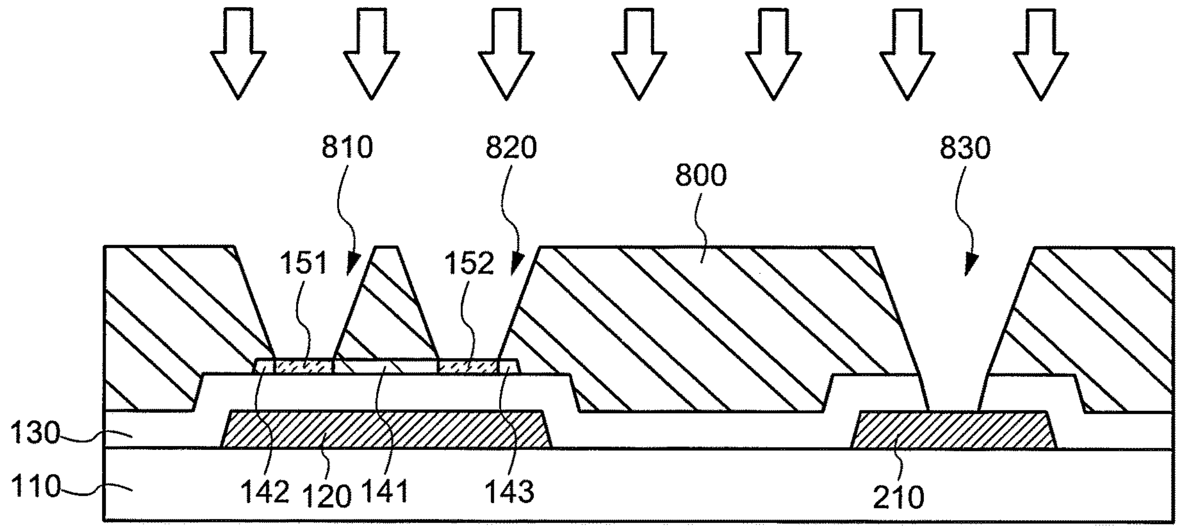
FIG. 3B is a schematic cross-sectional view illustrating a method for manufacturing a semiconductor device according to an embodiment of the present invention.
Figure 3C:
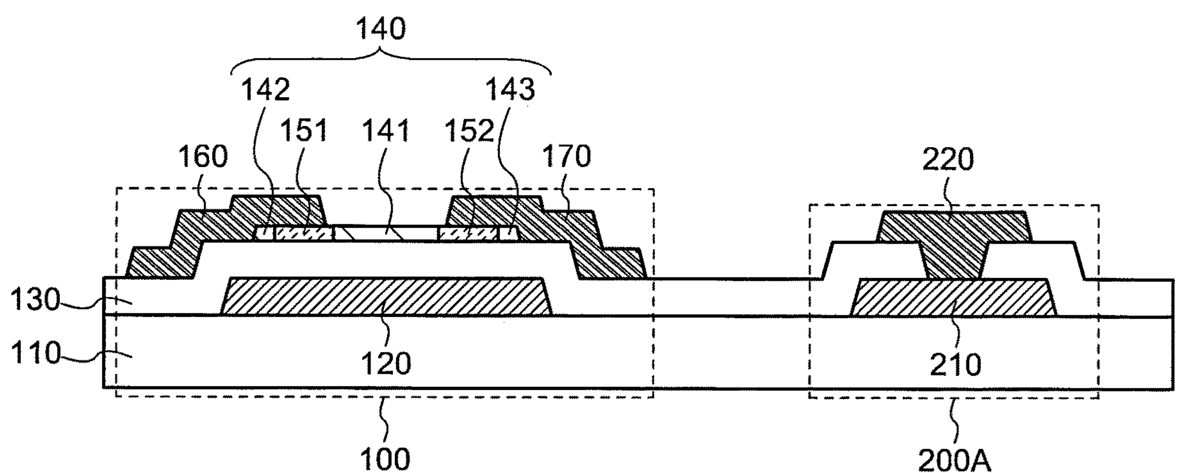
FIG. 3C is a schematic cross-sectional view illustrating a method for manufacturing a semiconductor device according to an embodiment of the present invention.

Each of FIGS. 3A to 3C is a schematic cross-sectional view illustrating a method for manufacturing the semiconductor device 10A according to an embodiment of the present invention. The description of a process that is usually performed as a method for manufacturing a semiconductor device may be omitted below.

After the resist layer 800 shown in FIG. 2B is formed, an impurity element is added into the oxide semiconductor layer 140 using the resist layer 800 as a mask (see FIG. 3A). The impurity element is added into the oxide semiconductor layer 140 through the first opening 810 and the second opening 820 to form the first impurity region 151 and the second impurity region 152 in the oxide semiconductor layer 140. Further, the impurity element is added into the first insulating layer 130 through the third opening 830 to form a third impurity region 233 in the first insulating layer 130.

Then, the first insulating layer 130 is etched using the resist layer 800 as a mask (see FIG. 3B). Dry etching is performed using an etching gas with a high etching selectivity between the first insulating layer 130 and the oxide semiconductor layer 140. However, the process may be performed by wet etching. When the first insulating layer 130 is etched, the third impurity region 233 is also etched. Therefore, the first insulating layer 130 is etched without the third impurity region 233 serving as an etch stopper (i.e., an opening is formed in the first insulating layer 130), and a part of the first connection electrode 210 is exposed.

Then, after removing the resist layer 800, the second conductive layer 160 and the third conductive layer 170 are formed to complete the semiconductor device 10A (see FIG. 3C). The semiconductor device 10A includes the transistor 100 and a connection portion 200A. In the semiconductor device 10A, since the third impurity region 233 is formed in the first insulating layer 130 and etched, the connection portion 200A does not include the third impurity region. That is, the third impurity region is not formed in the first connection electrode 210 in the connection portion 200A.

In the connection portion 200A of the semiconductor device 10A, a region added with the impurity element may be provided on the side surface of the opening of the first insulating layer 130 without completely etching the third impurity region 233.

Also in the manufacturing method of the semiconductor device 10A according to the present embodiment, the impurity element can be added into the oxide semiconductor layer 140 using a mask for forming the opening of the first insulating layer 130 in the connection portion 200A. Therefore, it is not necessary to pattern a mask for adding the impurity element, and the cost and takt time in manufacturing the semiconductor device 10A can be reduced. Therefore, the semiconductor device 10A can be manufactured at low cost.

Second Embodiment

A semiconductor device 30 according to an embodiment of the present invention is described with reference to FIGS. 4 to 5D.

[1. Configuration of Semiconductor Device 30]

A configuration of a semiconductor device 30 according to an embodiment of the present invention is described with reference to FIG. 4. In addition, in the description of the semiconductor device 30, the description of the same configuration as the semiconductor device 10 may be omitted.

Figure 4:
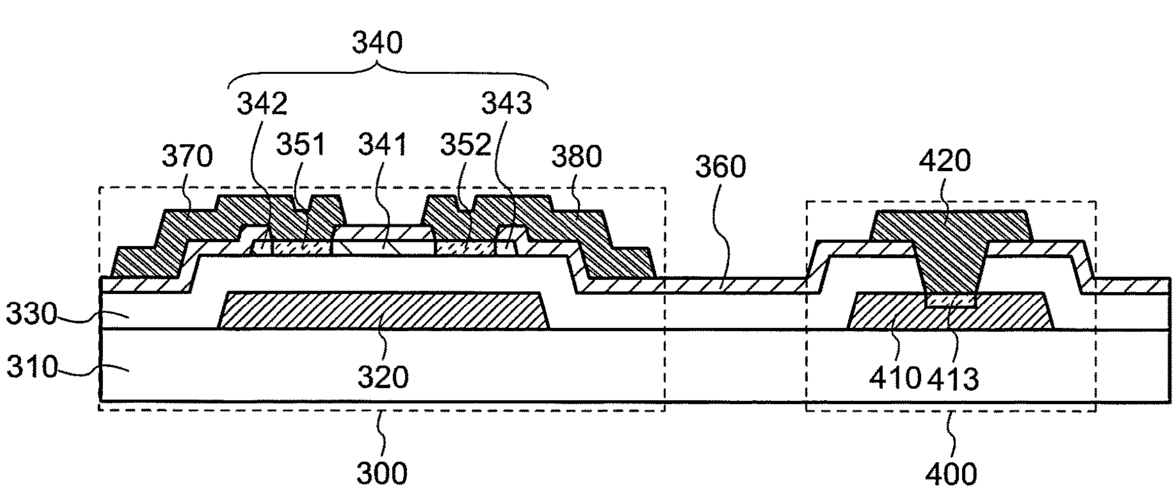
FIG. 4 is a schematic cross-sectional view of a semiconductor device according to an embodiment of the present invention.

FIG. 4 is a schematic cross-sectional view of a semiconductor device 30 according to an embodiment of the invention. As shown in FIG. 4, the semiconductor device 10 includes a transistor 300 and a connection portion 400.

The transistor 300 includes a substrate 310, a first conductive layer 320, a first insulating layer 330, an oxide semiconductor layer 340, a second insulating layer 360, a second conductive layer 370, and a third conductive layer 380. The first conductive layer 320 is provided on the substrate 310. The first insulating layer 330 is provided on the first conductive layer 320 so as to cover the first conductive layer 320. The oxide semiconductor layer 340 is provided on the first insulating layer 330. The second insulating layer 360 is provided on the oxide semiconductor layer 340 so as to cover end portions and a central portion of the oxide semiconductor layer 340. That is, the second insulating layer 360 is provided so as to expose parts of the oxide semiconductor layer 340. Each of the second conductive layer 370 and the third conductive layer 380 is provided on the second insulating layer 360 and the oxide semiconductor layer 340. Each of the second conductive layer 370 and the third conductive layer 380 is electrically connected to the oxide semiconductor layer 340.

The oxide semiconductor layer 340 includes a first region 341, a second region 342, a third region 343, a first impurity region 351, and a second impurity region 352. The first impurity region 351 is located between the first region 341 and the second region 342. The second impurity region 352 is located between the first region 341 and the third region 343. The first region 341 overlaps the second insulating layer 360 and can function as a channel formation region. The second region 342 and the third region 343 also overlap the second insulating layer 360. The second insulating layer 360 can protect the channel formation region of the first region 341 and the edges of the second region 342 and the third region 343. That is, the second insulating layer 360 can function as a so-called channel protective layer.

For example, silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), or the like can be used as a material for the second insulating layer 360. The second insulating layer 360 may have a single-layer structure or a stacked-layer structure. When the second insulating layer 360 has a stacked-layer structure, it is preferable that the second insulating layer 360 has a stacked-layer structure of an oxide layer and a nitride layer and the oxide layer is in contact with the oxide semiconductor layer 340.

The second conductive layer 370 is electrically connected to the first impurity region 351. Further, the third conductive layer 380 is electrically connected to the second impurity region 352. Since each of the first impurity region 351 and the second impurity region 352 can function as a low-resistance region, the connection between the second conductive layer 370 and the first impurity region 351 and the connection between the third conductive layer 380 and the second impurity region 352 are ohmic contact connections.

The connection portion 400 includes the substrate 310, a first connection electrode 410, the first insulating layer 330, the second insulating layer 360, and a second connection electrode 420. The first insulating layer 330 is provided on the first connection electrode 410 so as to cover the first connection electrode 410. The second connection electrode 220 is provided on the second insulating layer 360. The second connection electrode 420 is electrically connected to the first connection electrode 410 through an opening provided in the first insulating layer 330 and the second insulating layer 360. Further, the first connection electrode 410 includes a third impurity region 413. It can also be said that the second connection electrode 420 is in contact with the third impurity region 413 and is electrically connected to the third impurity region 413.

In the semiconductor device 30 according to the present embodiment, the first impurity region 351 and the second impurity region 352 having high electrical conductivity are provided in the oxide semiconductor layer 340 of the transistor 300. The second conductive layer 370 and the third conductive layer 380 that correspond to the source electrode and the drain electrode are electrically connected to the first impurity region 351 and the second impurity region 352, respectively. Therefore, the connection between the second conductive layer 370 and the first impurity region 351 and the connection between the third conductive layer 380 and the second impurity region 352 are ohmic contact connections, and the interface between the oxide semiconductor layer 340 and the second conductive layer 370 and the interface between the oxide semiconductor layer 340 and the third conductive layer 380 are stabilized. Further, the channel formation region and the edge of the oxide semiconductor layer 340 are protected by the second insulating layer 360. Therefore, the reliability of transistor 300 is improved. In particular, the negative bias temperature instability of transistor 300 is improved.

[2. Manufacturing Method of Semiconductor Device 30]

A method for manufacturing the semiconductor device 30 according to an embodiment of the present invention is described with reference to FIGS. 5A to 5D.

Each of FIGS. 5A to 5D is a schematic cross-sectional view illustrating a method of manufacturing the semiconductor device 30 according to an embodiment of the present invention. The description of a process that is usually performed as a method for manufacturing a semiconductor device may be omitted below.

Figure 5A:
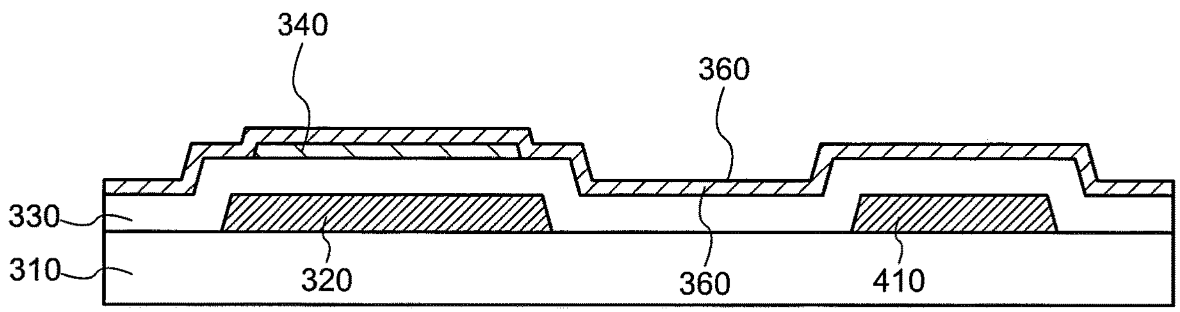
FIG. 5A is a schematic cross-sectional view illustrating a method for manufacturing a semiconductor device according to an embodiment of the present invention.

The first conductive layer 320, the first insulating layer 330, the oxide semiconductor layer 340, and the second insulating layer 360 are sequentially formed over the substrate 310 (see FIG. 5A). Each of the first conductive layer 320, the first insulating layer 330, the oxide semiconductor layer 340, and the second insulating layer 360 can be deposited using sputtering, CVD, or the like. Further, each of the patterns of the first conductive layer 320 and the oxide semiconductor layer 340 can be formed using photolithography.

Figure 5B:
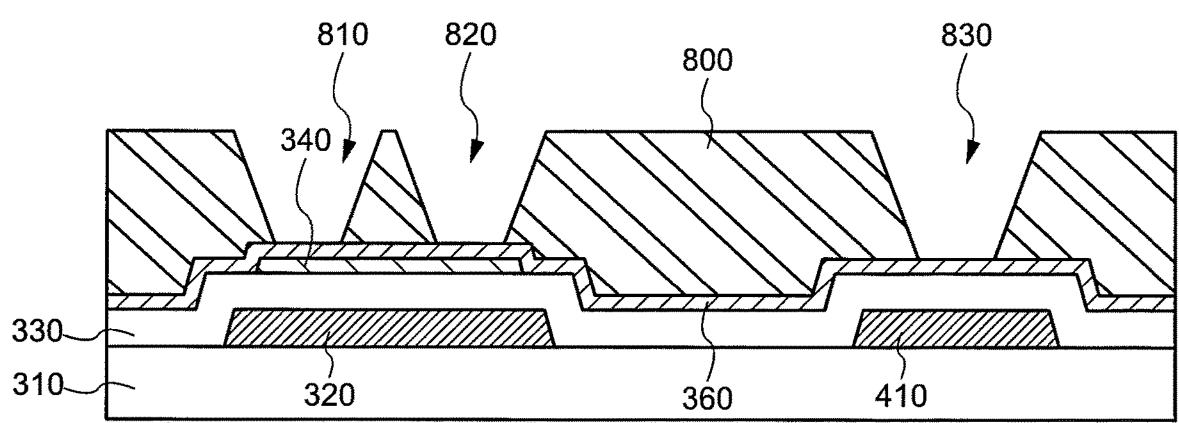
FIG. 5B is a schematic cross-sectional view illustrating a method for manufacturing a semiconductor device according to an embodiment of the present invention.

Then, a resist layer 800 that includes a first opening 810 and a second opening 820 overlapping the first conductive layer 320 and a third opening 830 overlapping the first connection electrode 410 are formed over the second insulating layer 360 (see FIG. 5B). The first opening 810, the second opening 820, and the third opening 830 can be formed by a patterning process of photolithography.

Figure 5C:
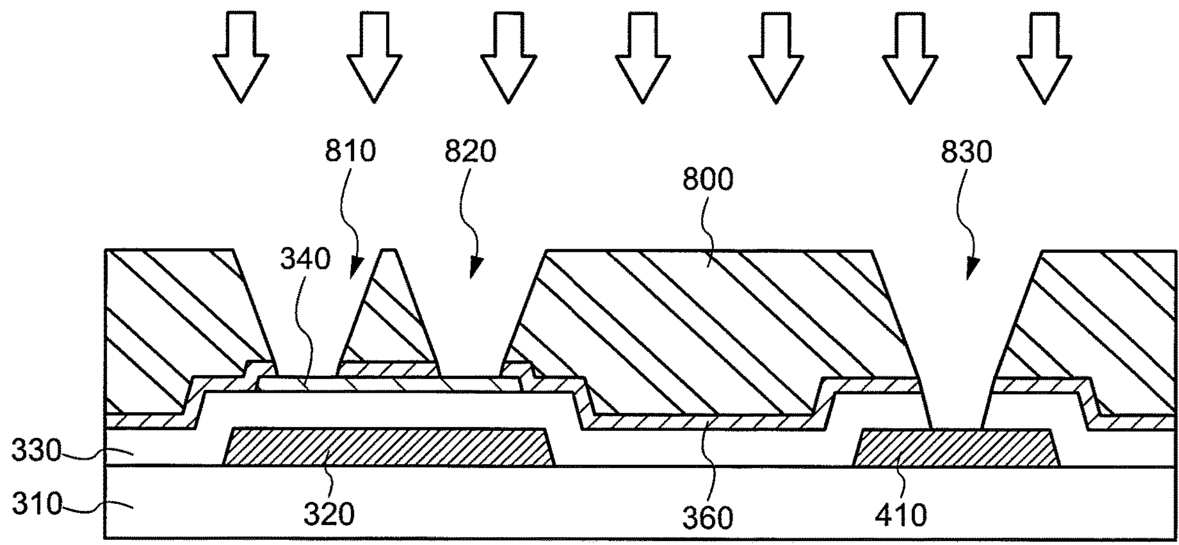
FIG. 5C is a schematic cross-sectional view illustrating a method for manufacturing a semiconductor device according to an embodiment of the present invention.

Then, the second insulating layer 360 and the first insulating layer 330 are etched using the resist layer 800 as a mask (see FIG. 5C). It is preferable that the etching of the second insulating layer 360 and the first insulating layer 330 is performed by dry etching using an etching gas capable of increasing the etching selectivity between the first insulating layer 330 and the oxide semiconductor layer 140. First, the second insulating layer 360 exposed by the first opening 810, the second opening 820, and the third opening 830 is etched. Next, the first insulating layer 330 exposed by the third opening 830 is etched (i.e., openings are formed in the first insulating layer 330 and the second insulating layer 360), and a portion of the connection electrode 410 is exposed. Since the etching selectivity between the first insulating layer 330 and the oxide semiconductor layer 340 is high, the oxide semiconductor layer 340 exposed through the first opening 810 and the second opening 820 is hardly etched.

Figure 5D:
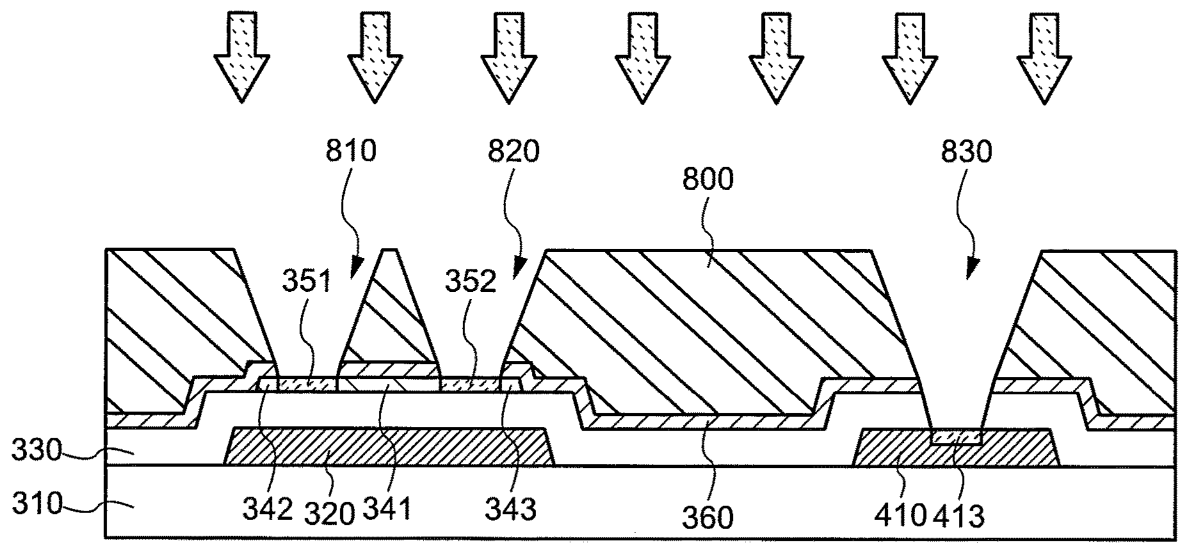
FIG. 5D is a schematic cross-sectional view illustrating a method for manufacturing a semiconductor device according to an embodiment of the present invention.

Then, an impurity element is added into the oxide semiconductor layer 340 using the resist layer 800 as a mask (see FIG. 5D). The impurity element is added into the oxide semiconductor layer 340 through the first opening 810 and the second opening 820 to form the first impurity region 351 and the second impurity region 352 in the oxide semiconductor layer 340. The impurity element is added into the first connection electrode 410 through the third opening 830 to form the third impurity region 413 in the first connection electrode 410.

Then, after removing the resist layer 800, the second conductive layer 370, the third conductive layer 380, and the second connection electrode 420 are formed, and the semiconductor device 30 shown in FIG. 4 can be manufactured.

In the method for manufacturing the semiconductor device 30 according to the present embodiment, the impurity element can be added into the oxide semiconductor layer 340 using the mask for forming the opening of the first insulating layer 330 and the second insulating layer 360 in the connection portion 400. Therefore, it is not necessary to pattern a mask for adding the impurity element, and the cost and takt time in manufacturing the semiconductor device 30 can be reduced. Therefore, the semiconductor device 30 can be manufactured at low cost.

<Modification 2>

A semiconductor device 30A, which is a modification of the semiconductor device 30 according to an embodiment of the present invention, is described with reference to FIGS. 6A to 6C. In the description of the semiconductor device 30A, the description of the same configuration as the semiconductor device 30 may be omitted. In addition, the modification of the semiconductor device 30 is not limited to the semiconductor device 30A.

Figure 6A:
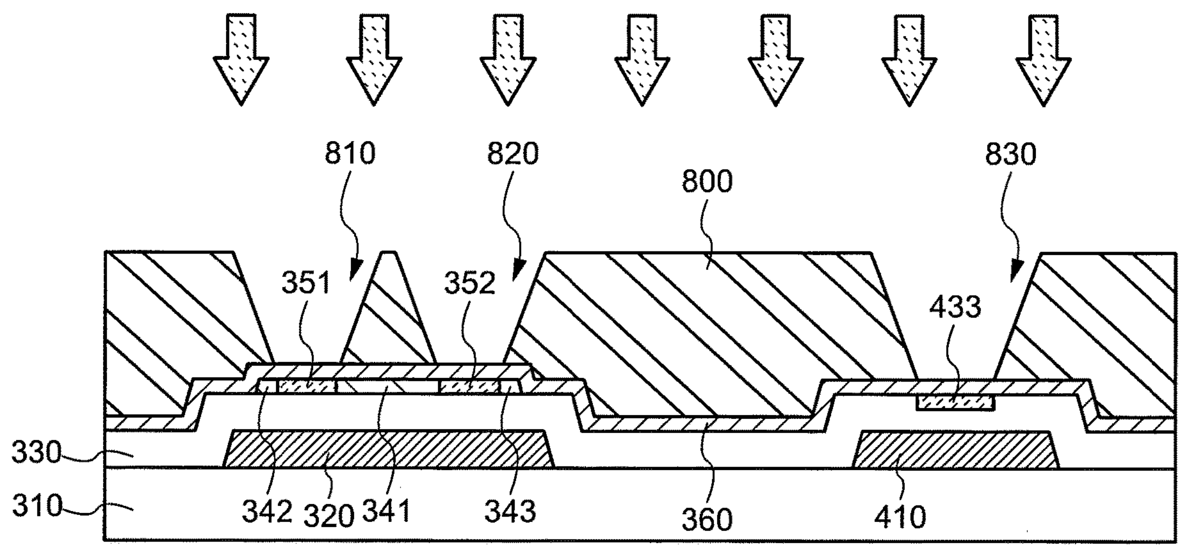
FIG. 6A is a schematic cross-sectional view illustrating a method for manufacturing a semiconductor device according to an embodiment of the present invention.
Figure 6B:
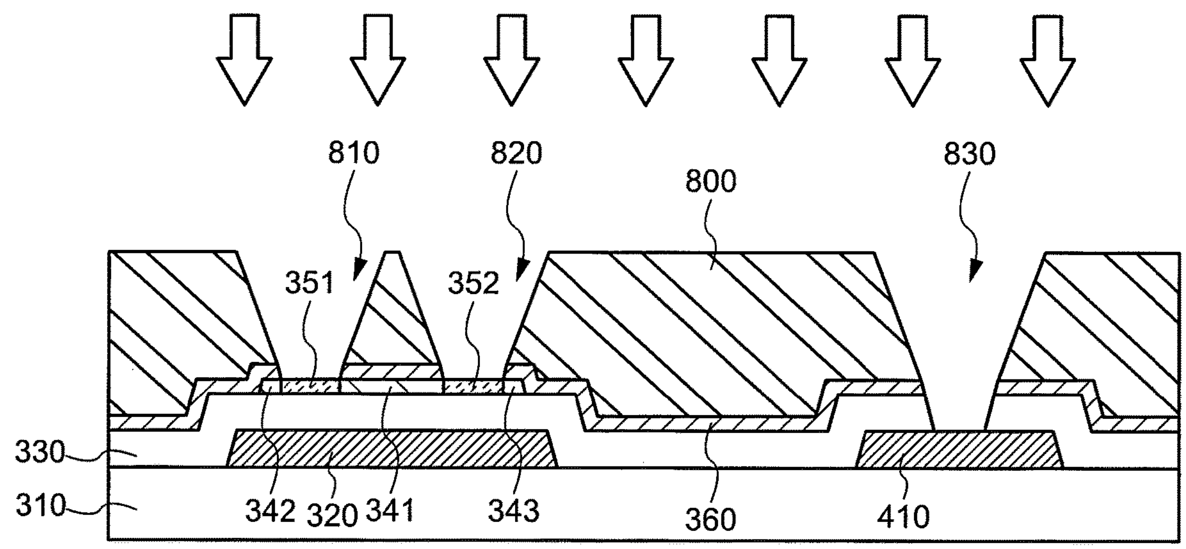
FIG. 6B is a schematic cross-sectional view illustrating a method for manufacturing a semiconductor device according to an embodiment of the present invention.
Figure 6C:
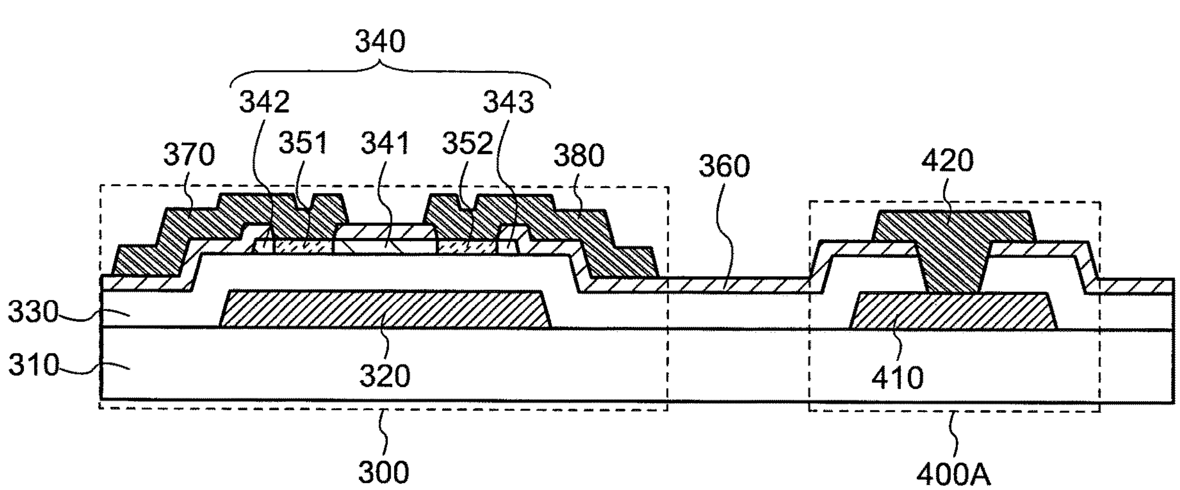
FIG. 6C is a schematic cross-sectional view illustrating a method for manufacturing a semiconductor device according to an embodiment of the present invention.

Each of FIGS. 6A to 6C is a schematic cross-sectional view illustrating a method for manufacturing the semiconductor device 30A according to an embodiment of the present invention. The description of a process that is usually performed as a method for manufacturing a semiconductor device is omitted below.

After the resist layer 800 shown in FIG. 5B is formed, an impurity element is added into the oxide semiconductor layer 340 through the second insulating layer 360 using the resist layer 800 as a mask (see FIG. 6A). The impurity element is added into the oxide semiconductor layer 340 through the first opening 810 and the second opening 820 to form the first impurity region 351 and the second impurity region 352 in the oxide semiconductor layer 340. Further, the impurity element is added into the first insulating layer 330 through the third opening 830 to form a third impurity region 433 in the first insulating layer 330.

Then, the second insulating layer 360 and the first insulating layer 330 are etched using the resist layer 800 as a mask (see FIG. 6B). It is preferable that the etching of the second insulating layer 360 and the first insulating layer 330 is performed by dry etching using an etching gas capable of increasing the etching selectivity between the first insulating layer 330 and the oxide semiconductor layer 140. First, the second insulating layer 360 exposed by the first opening 810, the second opening 820, and the third opening 830 is etched. Next, the first insulating layer 330 exposed by the third opening 830 is etched (i.e., an opening is formed in the first insulating layer 330 and the second insulating layer 360), and a part of the connection electrode 410 is exposed. Since the etching selectivity between the first insulating layer 330 and the oxide semiconductor layer 340 is high, the oxide semiconductor layer 340 exposed through the first opening 810 and the second opening 820 is hardly etched.

Then, after removing the resist layer 800, the second conductive layer 370 and the third conductive layer 380 are formed to complete the semiconductor device 30A (see FIG. 6C). The semiconductor device 30A includes the transistor 300 and the connection portion 400A. In the semiconductor device 30A, since the third impurity region 433 is formed in the second insulating layer 360 and is etched, the connection portion 400A does not include the third impurity region. That is, the third impurity region is not formed in the first connection electrode 410 in the connection portion 400A.

In the connection portion 400A of the semiconductor device 30A, a region added with the impurity element may be provided on the side surface of the opening of the first insulating layer 330 without completely etching the third impurity region 433.

Also in the manufacturing method of the semiconductor device 30A according to the present embodiment, the impurity element can be added into the oxide semiconductor layer 340 using a mask for forming the opening of the first insulating layer 330 and the second insulating layer 360 in the connection portion 400A. Therefore, it is not necessary to pattern a mask for adding the impurity element, and the cost and takt time in manufacturing the semiconductor device 30A can be reduced. Therefore, the semiconductor device 30A can be manufactured at low cost.

Third Embodiment

A semiconductor device 50 according to an embodiment of the present invention is described with reference to FIGS. 7A to 8. In addition, in the description of the semiconductor device 50, the description of the same configuration as the semiconductor device 10 may be omitted.

Figure 7A:
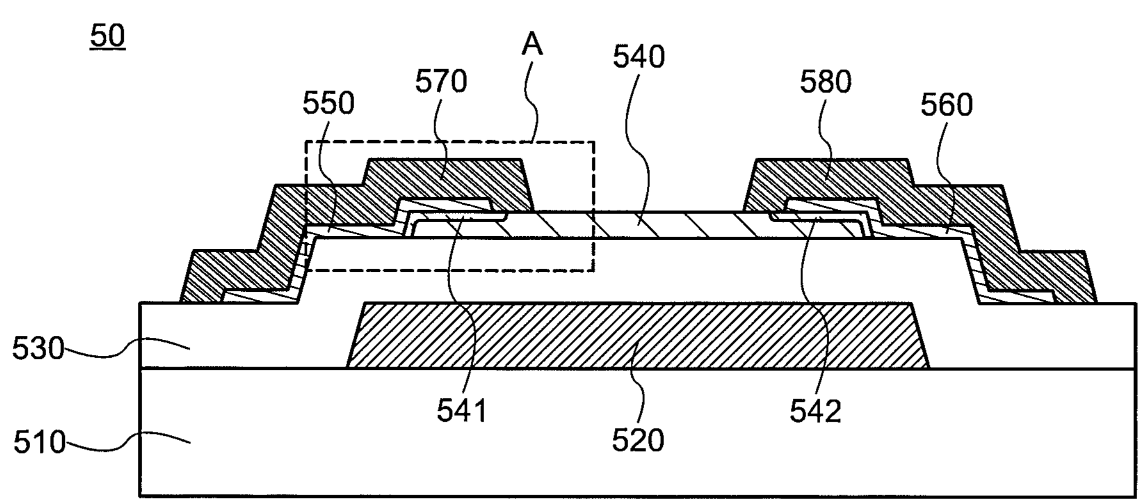
FIG. 7A is a schematic cross-sectional view of a semiconductor device according to an embodiment of the present invention.
Figure 7B:
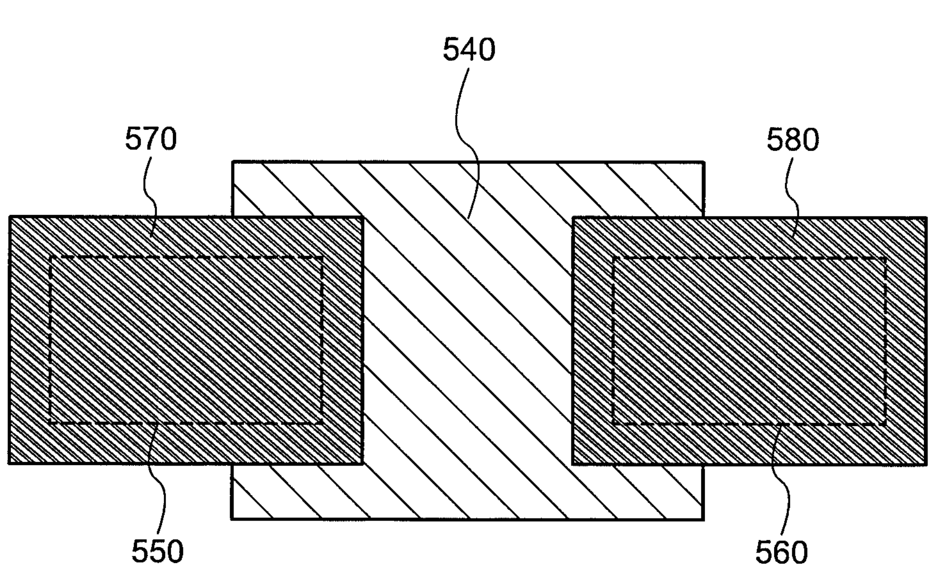
FIG. 7B is a schematic plan view of a semiconductor device according to an embodiment of the present invention.

FIGS. 7A and 7B are a schematic cross-sectional view and a schematic plan view, respectively, of the semiconductor device 50 according to an embodiment of the present invention. As shown in FIGS. 7A and 7B, the semiconductor device 50 includes a substrate 510, a first conductive layer 520, a first insulating layer 530, an oxide semiconductor layer 540, a first oxygen absorption layer 550, a second oxygen absorption layer 560, a second conductive layer 570, and a third conductive layer 580. The first conductive layer 520 is provided on the substrate 510. The first insulating layer 530 is provided on the first conductive layer 520 so as to cover the first conductive layer 520. The oxide semiconductor layer 540 is provided on the first insulating layer 530. Each of the first oxygen absorption layer 550 and the second oxygen absorption layer 560 is provided on the first insulating layer 530 and the oxide semiconductor layer 540. The second conductive layer 570 is provided on the first insulating layer 530, the oxide semiconductor layer 540, and the first oxygen absorption layer 550 so as to cover the first oxygen absorption layer 550. The third conductive layer 580 is provided on the first insulating layer 530, the oxide semiconductor layer 540, and the second oxygen absorption layer 560 so as to cover the second oxygen absorption layer 560. Each of the second conductive layer 570 and the third conductive layer 580 is electrically connected to the oxide semiconductor layer 540.

The first oxygen absorption layer 550 covers at least a part of one end of the oxide semiconductor layer 540 and is in contact with at least the part of the one end of the oxide semiconductor layer 540. In a plan view, the second conductive layer 570 is provided so as to cover the entire surface of the first oxygen absorption layer 550. Similarly, the second oxygen absorption layer 560 covers at least a part of the other end of the oxide semiconductor layer 540 and is in contact with at least the part of the other end of the oxide semiconductor layer 540. Further, in the plan view, the third conductive layer 580 is provided so as to cover the entire surface of the second oxygen absorption layer 560.

In the plan view, the shape of each of the first oxygen absorption layer 550 and the second oxygen absorption layer 560 is not limited to a rectangle. The shape of each of the first oxygen absorption layer 550 and the second oxygen absorption layer 560 may be a shape including not only a straight line but also a curved line.

Figure 8:
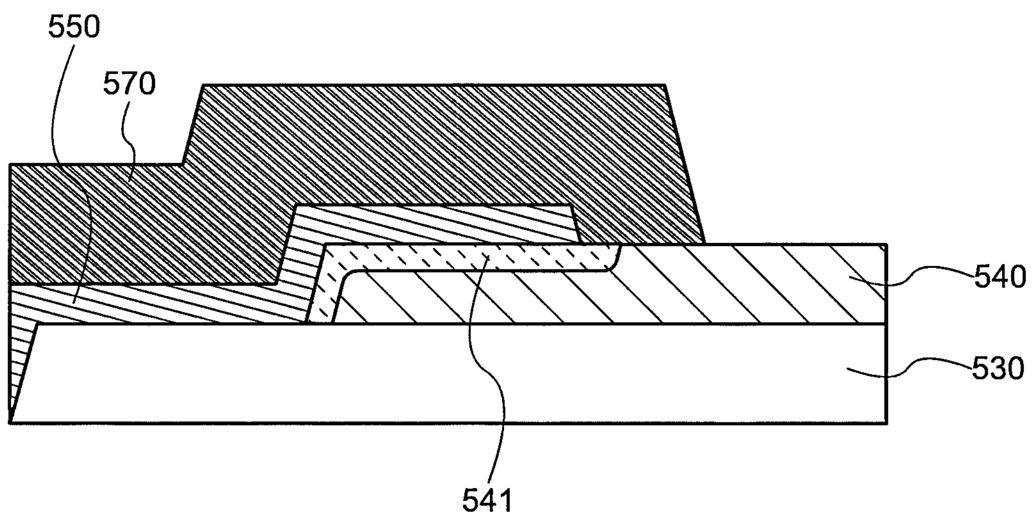
FIG. 8 is a schematic enlarged cross-sectional view of a semiconductor device according to an embodiment of the present invention.

FIG. 8 is a schematic enlarged cross-sectional view of the semiconductor device 50 according to an embodiment of the present invention. Specifically, FIG. 8 is an enlarged cross-sectional view of a region A shown in FIG. 7A. Oxygen vacancies are more likely to occur in the oxide semiconductor layer 540 than in the first insulating layer 530. Therefore, when the first oxygen absorption layer 550 is in contact with the oxide semiconductor layer 540, the first oxygen absorption layer 550 absorbs oxygen in the oxide semiconductor layer 540. As a result, a region in which oxygen vacancies are generated is formed in the oxide semiconductor layer 540. That is, as shown in FIG. 8, a first oxygen-deficient region 541 in contact with the first oxygen absorption layer 550 is formed in the oxide semiconductor layer 540. Since not only oxygen in the portion in direct contact with the first oxygen-absorbing layer 550 but also oxygen in the vicinity of the portion in direct contact is absorbed, the first oxygen-deficient region 541 expands to some extent. That is, the surface area of the first oxygen-deficient region 541 is larger than the surface area of the portion of the oxide semiconductor layer 540 that is in direct contact with the first oxygen absorption layer 550.

Since the first oxygen-deficient region 541 has many oxygen deficiencies, the first oxygen-deficient region 541 has a large carrier density. That is, the electrical conductivity of the first oxygen-deficient region 541 is greater than the electrical conductivity of a region in the oxide semiconductor layer 540 where the first oxygen-deficient region 541 is not formed. Since the first oxygen-deficient region 541 also extends in the vicinity of the portion in direct contact with the first oxygen absorption layer 550, the second conductive layer 570 covering the first oxygen absorption layer 550 is in contact with the oxygen-deficient region 541. That is, the connection between the second conductive layer 570 and the first oxygen-deficient region 541 is an ohmic contact connection. Similarly, the electrical conductivity of the second oxygen-deficient region 542 is greater than the electrical conductivity of a region in the oxide semiconductor layer 540 where the second oxygen-deficient region 542 is not formed. Further, the connection between the third conductive layer 580 and the second oxygen-deficient region 542 is an ohmic contact connection.

For example, calcium (Ca) or a compound thereof, a metal such as aluminum (Al), silver (Ag), or magnesium (Mg); or an alloy thereof can be used as a material for each of the first oxygen absorption layer 550 and the second oxygen absorption layer 560. Further, a material containing the above metal or an alloy in resin such as polyolefin resin, polyester resin, polyamide resin, or polyvinyl alcohol resin can also be used as the material of each of the first oxygen absorption layer 550 and the second oxygen absorption layer 560.

In the semiconductor device 50, the second conductive layer 570 and the third conductive layer 580 can function as a source electrode and a drain electrode, respectively. The first oxygen absorption layer 550 and the second oxygen absorption layer 560 that have absorbed oxygen may have conductive properties or may have insulating properties.

At least a region of the first oxygen absorption layer 550 overlapping the oxide semiconductor layer 540 may be covered with the second conductive layer 570. That is, a region of the first oxygen absorption layer 550 that does not overlap the oxide semiconductor layer 540 does not need to be covered with the second conductive layer 570. In this case, the first oxygen absorption layer 550 can also be used as a wiring layer different from the second conductive layer 570. Similarly, the second oxygen absorption layer 560 can also be used as a wiring layer different from the third conductive layer 580.

In the semiconductor device 50 according to the present embodiment, the first oxygen absorption layer 550 and the second oxygen absorption layer 560 are in contact with the oxide semiconductor layer 540, so that the first oxygen-deficient region 541 and the second oxygen-deficient region 542 having high electrical conductivity are formed in the oxide semiconductor layer 540. Further, the second conductive layer 570 and the third conductive layer 580 that correspond to the source electrode and the drain electrode of the transistor are electrically connected to the first oxygen-deficient region 541 and the second oxygen-deficient region 542, respectively. Therefore, since the connection between the second conductive layer 570 and the first oxygen-deficient region 541 and the connection between the third conductive layer 580 and the second oxygen-deficient region 542 are ohmic contact connections, the interface between the oxide semiconductor layer 540 and the second conductive layer 570 and the interface between the oxide semiconductor layer 540 and the third conductive layer 580 are stabilized. Therefore, the reliability of the semiconductor device 50 is improved. In particular, the negative bias temperature instability of the semiconductor device 50 is improved.

<Modification 3>

A semiconductor device 50A, which is a modification of the semiconductor device 50 according to an embodiment of the present invention, is described with reference to FIG. 9. In the description of the semiconductor device 50A, the description of the configuration similar to the semiconductor device 50 may be omitted. In addition, the modification of the semiconductor device 50 is not limited to the semiconductor device 50A.

Figure 9:
FIG. 9 is a schematic plan view of a semiconductor device according to an embodiment of the present invention.
Figure 9:
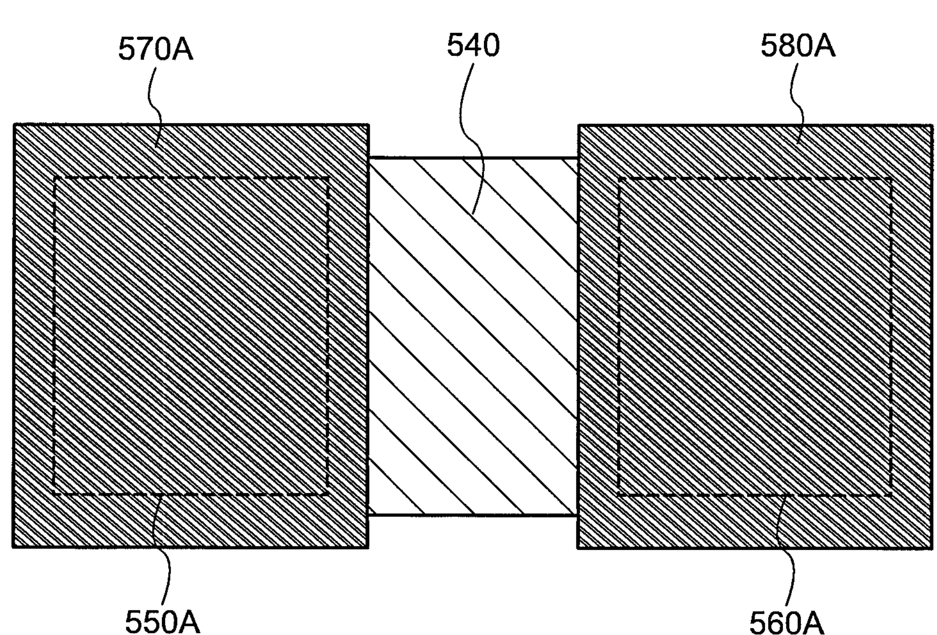

FIG. 9 is a schematic plan view of the semiconductor device 50A according to an embodiment of the present invention. As shown in FIG. 9, the semiconductor device 50A includes the oxide semiconductor layer 540, a first oxygen absorption layer 550A, a second oxygen absorption layer 560A, a second conductive layer 570A, and a third conductive layer 580A.

The first oxygen absorption layer 550A covers at least a part of one end of the oxide semiconductor layer 540 and is in contact with at least the part of one end of the oxide semiconductor layer 540. In a plan view, the second conductive layer 570A covers the entire surface of one end of the oxide semiconductor layer 540. Similarly, the second oxygen absorption layer 560A covers at least a part of the other end of the oxide semiconductor layer 540 and is in contact with at least the part of the other end of the oxide semiconductor layer 540. In the plan view, the third conductive layer 580A covers the entire surface of the other end of the oxide semiconductor layer 540.

Also in the semiconductor device 50A, the first oxygen absorption layer 550A and the second oxygen absorption layer 560A are in contact with the oxide semiconductor layer 540 and absorb oxygen in the oxide semiconductor layer 540. As a result, the oxygen-deficient regions are formed in the oxide semiconductor layer 540. The second conductive layer 570A and the third conductive layer 580A that correspond to the source electrode and the drain electrode of the transistor are electrically connected to the oxygen-deficient regions. Thus, the interface between the oxide semiconductor layer 540 and the second conductive layer 570A and the interface between the oxide semiconductor layer 540 and the third conductive layer 580A are stabilized. Therefore, the reliability of the semiconductor device 50A is improved. In particular, the negative bias temperature instability of the semiconductor device 50A is improved.

Fourth Embodiment

A semiconductor device 60 according to an embodiment of the present invention is described with reference to FIGS. 10A and 10B. In addition, in the description of the semiconductor device 60, the description of the configuration similar to the semiconductor device 50 may be omitted.

Figure 10A:
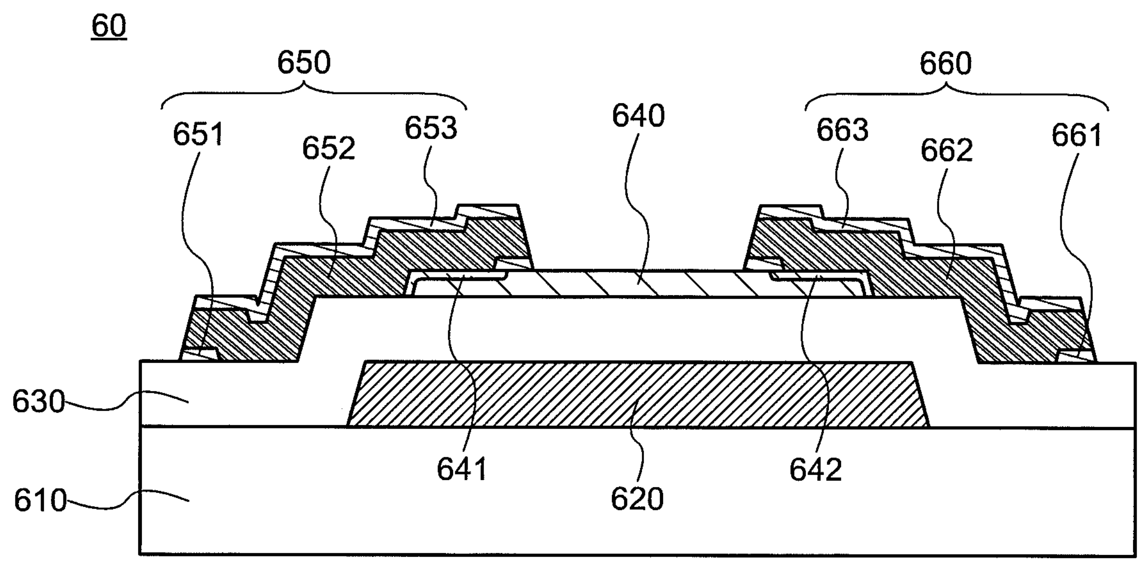
FIG. 10A is a schematic cross-sectional view of a semiconductor device according to an embodiment of the present invention.
Figure 10B:
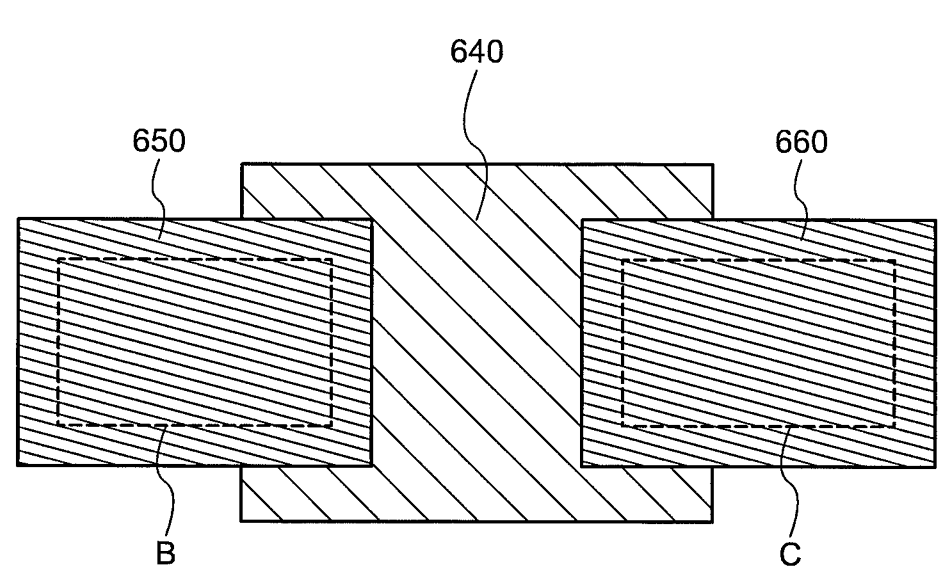
FIG. 10B is a schematic plan view of a semiconductor device according to an embodiment of the present invention.

FIGS. 10A and 10B are a schematic cross-sectional view and a schematic plan view, respectively, of the semiconductor device 60 according to an embodiment of the present invention. As shown in FIGS. 10A and 10B, the semiconductor device 60 includes a substrate 610, a first conductive layer 620, a first insulating layer 630, an oxide semiconductor layer 640, a second conductive layer 650, and a third conductive layer 660.

The second conductive layer 650 includes a first non-oxygen absorption layer 651, a first oxygen absorption layer 652, and a second non-oxygen absorption layer 653. Third conductive layer 660 includes a third non-oxygen absorption layer 661, a second oxygen absorption layer 662, and a fourth non-oxygen absorption layer 663. Each of the first oxygen absorption layer 652 and the second oxygen absorption layer 662 can absorb oxygen from the oxide semiconductor layer 640. On the other hand, each of the first non-oxygen absorption layer 651, the second non-oxygen absorption layer 653, the third non-oxygen absorption layer 661, and the fourth non-oxygen-absorbing layer 663 is a layer that absorbs less oxygen than each of the first oxygen absorption layer 652 and the second oxygen absorption layer 662 in the oxide semiconductor layer 640.

For example, titanium (Ti), molybdenum (Mo), tantalum (Ta), or tungsten (W), or an alloy thereof can be used as a material of each of the first non-oxygen absorption layer 651, the second non-oxygen absorption layer 653, the third non-oxygen absorption layer 661, and the fourth non-oxygen absorption layer 663. The third non-oxygen absorption layer 661 and the fourth non-oxygen absorption layer 663 can protect the first oxygen absorption layer 652 and the second oxygen absorption layer 662, respectively, from external influences. Therefore, when the first oxygen absorption layer 652 and the second oxygen absorption layer 662 are sufficiently stable, the third non-oxygen absorption layer 661 and the fourth non-oxygen absorption layer 663 may not be provided.

As shown in FIG. 10B, in a plan view, the second conductive layer 650 includes a region B inside, and the third conductive layer 660 includes a region C inside. FIG. 10A can also be referred to as a cross-sectional view cut through the region B and the region C. In the region B, the first non-oxygen absorption layer 651 is not provided. The first non-oxygen-absorption layer 651 is provided around the region B. That is, in the region B, the first oxygen absorption layer 652 and the second non-oxygen absorption layer 653 are stacked in order, and around the region B, the first non-oxygen absorption layer 651 and the first oxygen absorption layer 652, and the second non-oxygen absorption layer 653 are stacked in this order. Similarly, in the region C, the third non-oxygen absorption layer 661 is not provided. The third non-oxygen absorption layer 661 is provided around region C. That is, in the region C, the second oxygen-absorption layer 662 and the fourth non-oxygen-absorption layer 663 are stacked in order, and around the region C, the third non-oxygen absorption layer 661, the second oxygen absorption layer 662, and the fourth non-oxygen absorption layer 663 are stacked in this order.

The first oxygen absorption layer 652 covers at least a part of one end of the oxide semiconductor layer 640 and is in contact with at least the part of one end of the oxide semiconductor layer 640. Therefore, oxygen in the oxide semiconductor layer 640 is absorbed by the first oxygen-absorption layer 652, and a first oxygen-deficient region 641 is formed in the oxide semiconductor layer 640. Similarly, the second oxygen absorption layer 662 covers at least a part of the other end of the oxide semiconductor layer 640 and is in contact with at least the part of the other end of the oxide semiconductor layer 640. Therefore, oxygen in the oxide semiconductor layer 640 is absorbed by the second oxygen-absorption layer 662, and a second oxygen-deficient region 642 is formed in the oxide semiconductor layer 640.

The surface area of the first oxygen-deficient region 641 is larger than the surface area of a portion of the oxide semiconductor layer 640 that is in direct contact with the first oxygen-absorption layer 652. Therefore, the first non-oxygen absorption layer 651 is electrically connected to the oxide semiconductor layer 640 (specifically, the first oxygen-deficient region 641) through the ohmic contact connection. Similarly, the surface area of the second oxygen-deficient region 642 is larger than the surface area of a portion of the oxide semiconductor layer 640 that is in direct contact with the second oxygen-absorption layer 662. Therefore, the third non-oxygen absorption layer 661 is electrically connected to the oxide semiconductor layer 640 (specifically, the second oxygen-deficient region 642) through the ohmic contact connection.

In the semiconductor device 60, one of the stacked second conductive layers 650 is used as the first oxygen absorption layer 652 to form the first oxygen-deficient region 641 in the oxide semiconductor layer 640. Similarly, one of the stacked third conductive layers 660 is used as the second oxygen absorption layer 662 to form the second oxygen-deficient region 642 in the oxide semiconductor layer 640. Each of the second conductive layer 650 and the third conductive layer 660 that correspond to the source electrode and the drain electrode, respectively, of the transistor is electrically connected to the oxygen-deficient region in the oxide semiconductor layer 640 through the ohmic contact connection. Thus, the interface between the oxide semiconductor layer 640 and the second conductive layer 650 (more specifically, the first non-oxygen absorption layer 651) and the interface between the oxide semiconductor layer 540 and the third conductive layer 660 (more specifically, the third non-oxygen absorption layer 661) is stabilized. Therefore, the reliability of semiconductor device 60 is improved. In particular, the negative bias temperature instability of the semiconductor device 60 is improved.

Fifth Embodiment

The semiconductor devices according to the First to Fourth Embodiments can be applied to a display device such as a liquid crystal display device, an organic light emitting diode display device (OLED display device), or a micro LED display device. In the following description, a display device 1000 to which the semiconductor device 10 is applied is described with reference to FIGS. 11 to 13. Although the display device 1000 is an OLED display device, the display device to which the semiconductor device 10 is applied is not limited to this display device.

Figure 11:
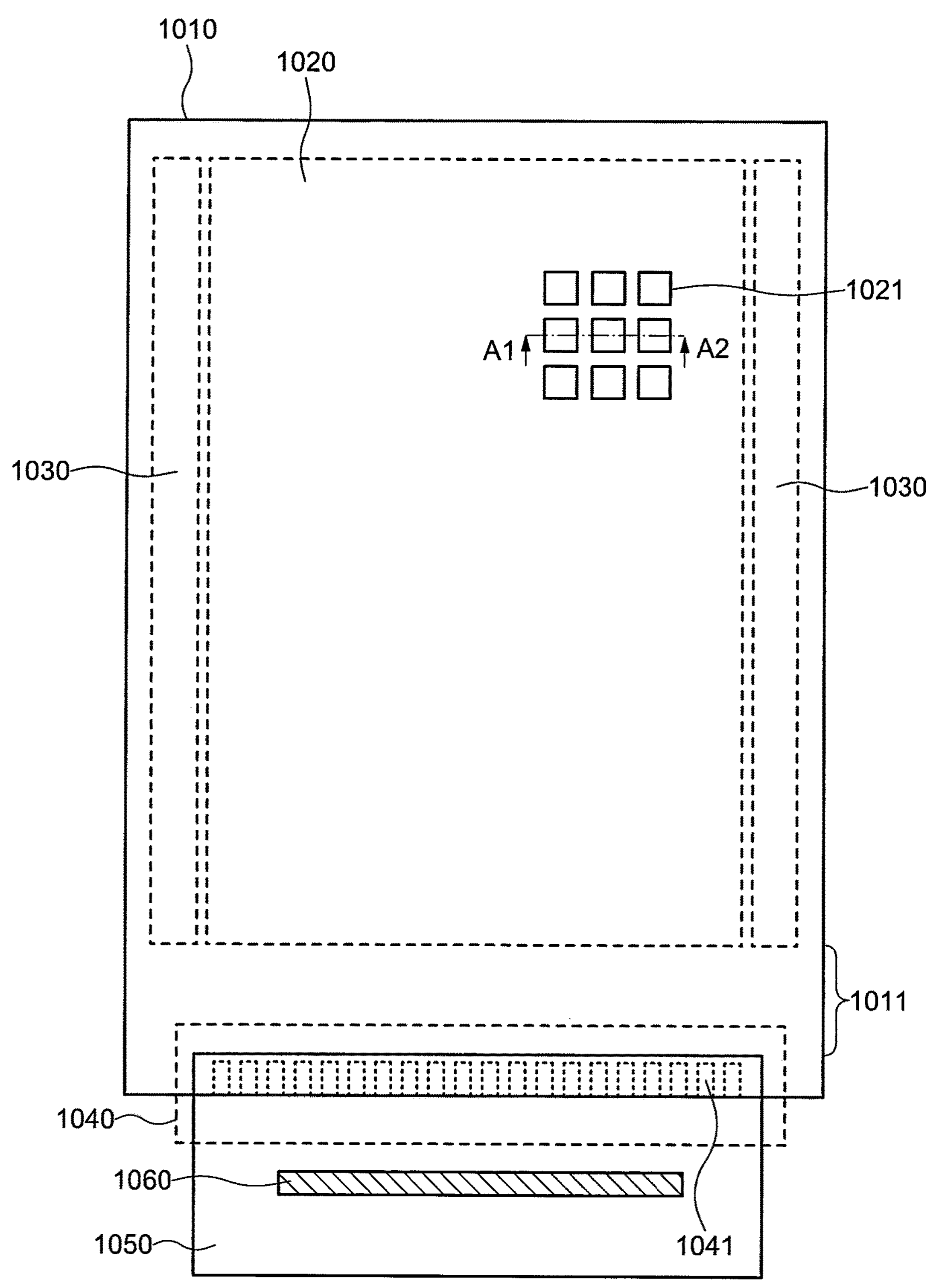
FIG. 11 is a schematic diagram showing a configuration of a display device according to an embodiment of the present invention.

FIG. 11 is a schematic diagram showing a configuration of the display device 1000 according to an embodiment of the present invention. The display device 1000 includes a display portion 1020, a driver circuit portion 1030, and a terminal portion 1040 on a substrate 1010. The driver circuit portion 1030 is provided around the display portion 1020 and can control the display portion 1020. For example, the drive circuit section 1030 includes a scan drive circuit. Further, the terminal portion 1040 is provided at an end portion of the substrate 1010 and can supply a signal or power to the display device 1000. For example, the terminal portion 1040 includes terminals 1041. The terminals 1041 are connected to flexible printed circuits 1050. A driver IC 1060 may be provided on the flexible printed circuits 1050.

The substrate 1010 may include a bent portion 1011. The substrate 1010 can be bent at the bent portion 1011. For example, the bent portion 1011 can be provided between the display portion 1020 and the terminal portion 1040. The terminal portion 1040 is bent at the bent portion 1011 so as to overlap the back surface of display portion 1020, so that the frame of display device 1000 can be narrowed.

The display portion 1020 can display an image or video, and includes a plurality of pixels 1021 arranged in a matrix. However, the arrangement of the plurality of pixels 1021 is not limited to a matrix. The plurality of pixels 1021 can also be arranged in a zigzag pattern, for example.

Figure 12:
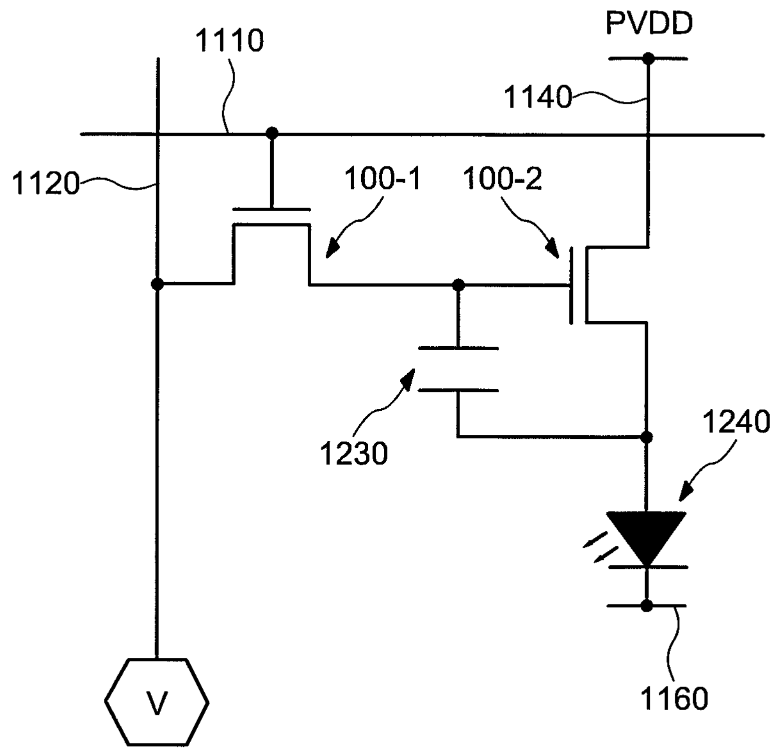
FIG. 12 is a circuit diagram (a pixel circuit) of a pixel of the display device according to an embodiment of the present invention.

FIG. 12 is a circuit diagram (pixel circuit) of the pixel 1021 of the display device 1000 according to an embodiment of the present invention. The pixel circuit includes a first transistor 100-1, a second transistor 100-2, a capacitive element 1230, and a light emitting element 1240.

The first transistor 100-1 can function as a select transistor. That is, the conduction state of the first transistor 100-1 is controlled by the scan line 1110. The gate, source, and drain of the first transistor 100-1 are electrically connected to a scan line 1110, a signal line 1120, and the gate of the second transistor 100-2, respectively.

The second transistor 100-2 can function as a drive transistor. That is, the second transistor 100-2 controls the light emission luminance of the light emitting element 1240. The gate, source, and drain of the second transistor 100-2 are electrically connected to the source of the first transistor 100-1, a driving power supply line 1140, and an anode of the light emitting element 1240, respectively.

One of the capacitor electrodes of the capacitive element 1230 is electrically connected to the gate of the second transistor 100-2 and the drain of the first transistor 100-1. The other of the capacitor electrodes is electrically connected to the anode of the light emitting element 1240 and the drain of the second transistor 100-2.

The anode of the light emitting element 1240 is connected to the drain of the second transistor 100-2. Further, a cathode of the light emitting element 1240 is connected to a reference power supply line 1160.

Figure 13:
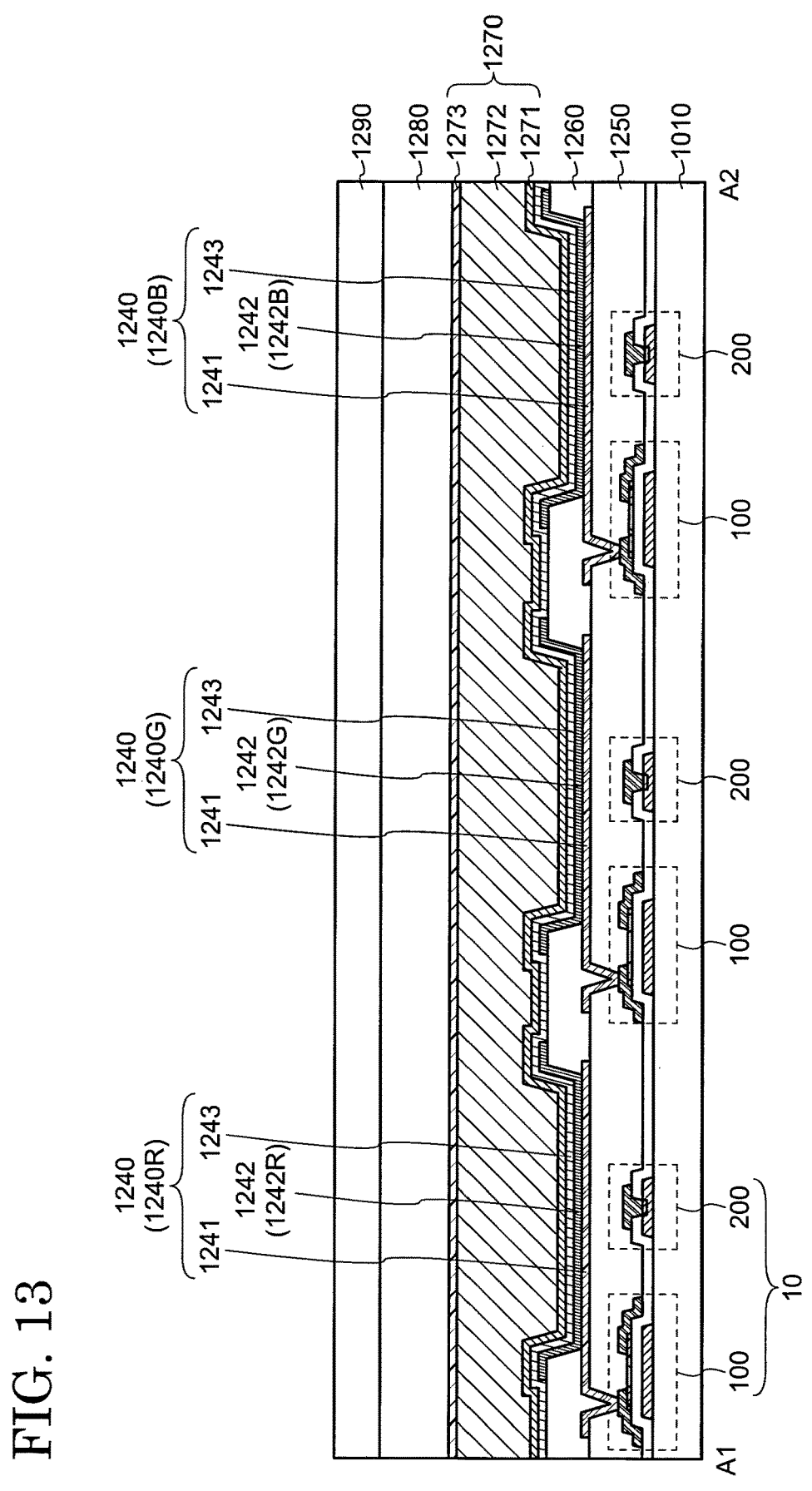

FIG. 13 is a cross-sectional view of the pixel 1021 of the display device 1000 according to an embodiment of the present invention. Specifically, FIG. 13 is a cross-sectional view of the display device 1000 shown in FIG. 11 taken along a line A1-A2. As shown in FIG. 13, the transistor 100 and the connection portion 200 of the semiconductor device 10 are provided on the substrate 1010.

A planarization layer 1250 is provided over the semiconductor device 10. For example, an organic material such as photosensitive acrylic or polyimide can be used as a material of the planarization layer 1250. The planarization layer 1250 is provided, so that a step between the transistor 100 and the connection portion 200 can be planarized.

An anode 1241 is provided over the planarization layer 1250. The anode 1241 is electrically connected to the transistor 100 through an opening provided in the planarization layer. The anode 1241 may be a transparent conductive film or a metal film. Further, the anode 1241 may be a stack of the transparent conductive film and the metal film.

The anode 1241 is provided for each light emitting element 1240. That is, the anode 1241 is provided for each of a red light emitting element 1240R, a green light emitting element 1240G, and a blue light emitting element 1240B.

A partition 1260 is provided over the anode 1241. The partition 1260 covers the end of the anode 1241 and is opened so that a part of the surface of the anode 1241 is exposed. In other words, the anodes 1241 of each light emitting element 1240 are separated by the partition 1260. The side surface of the opening of the partition 1260 preferably has a gradually tapered shape. If the side surface of the opening of the partition 1260 has a steep shape, poor coverage of the organic layer 1242 formed on the anode 1241 occurs. In addition, the partition 1260 may also be called a bank or a rib.

An organic layer 1242 including at least a hole-transporting layer, a light-emitting layer, and an electron-transporting layer is provided over the anode 1241 of each light emitting element 1240. Different organic materials for the light emitting layers of the organic layer 1242 may be used for the red light emitting element 1240R, the green light emitting element 1240G, and the blue light emitting element 1240B. That is, an organic layer 1242R containing a red light emitting material, an organic layer 1242G containing a green light emitting material, and an organic layer 1242B containing a blue light emitting material may be provided in the red light emitting element 1240R, the green light emitting element 1240G, and the blue light emitting element 1240B, respectively. In addition, the hole-transporting layer and the electron-transporting layer of the organic layer 1242 may be provided so as to cover all the light emitting elements 1240.

A cathode 1243 is provided over the organic layer 1242. The cathode 1243 may be provided so as to cover all the light emitting elements 1240. The cathode 1243 may be a transparent conductive film or a metal film. In addition, the anode 1241 may be a stack of the transparent conductive film and the metal film.

A sealing layer 1270 is provided over the cathode 1243. For example, the sealing layer 1270 can have a stacked structure of a first inorganic insulating layer 1271, an organic insulating layer 1272, and a second inorganic insulating layer 1273.

For example, silicon oxide, aluminum oxide, silicon nitride, aluminum nitride, silicon oxynitride, aluminum oxynitride, or the like can be used as a material for the first inorganic insulating layer 1271 and the second inorganic insulating layer 1273. For example, the film thicknesses of the first inorganic insulating layer 1271 and the second inorganic insulating layer 1273 are greater than or equal to 750 nm and less than or equal to 1250 nm. The first inorganic insulating layer 1271 or the second inorganic insulating layer 1273 may be a single-layer structure or a stack-layer structure. Since one of the functions of the sealing layer 1270 is to prevent moisture from entering the organic layer 1242 from the outside, the sealing layer 1270 is required to have a high gas barrier property. Therefore, the first inorganic insulating layer 1271 and the second inorganic insulating layer 1273 preferably contain a nitride such as silicon nitride or aluminum nitride. In addition, the nitride includes a nitride containing oxygen.

For example, an acrylic resin, an epoxy resin, a polyimide resin, a silicone resin, a fluororesin, a siloxane resin, or the like can be used as a material of the organic insulating layer 1272. For example, the film thickness of the organic insulating layer 1272 is greater than or equal to 5 μm and less than or equal to 15 μm.

A cover glass 1290 is provided over the sealing layer 1270 with an adhesive layer 1280 interposed therebetween. The display device 1000 may be provided with a polarizing plate, a touch sensor, or the like, if necessary.

Since the reliability of the semiconductor device 10 is improved in the display device 1000 according to the present embodiment, the reliability of the display device 1000 is improved as a result.

In addition, although the example in which the semiconductor device 10 is applied to the light emitting element 1240 is described in the above description, the semiconductor device 10 can also be applied to the scanning drive circuit.

Each of the embodiments described above as an embodiment of the present invention can be appropriately combined and implemented as long as they do not contradict each other. Additions, deletions, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A semiconductor device comprising:

a first conductive layer on an insulating surface;

a first insulating layer on the first conductive layer;

an oxide semiconductor layer on the first insulating layer;

a second conductive layer on the oxide semiconductive layer;

a third conductive layer on the oxide semiconductive layer;

a first connection electrode on the insulating surface, the first connection electrode comprising a third impurity region; and a second connection electrode on the first connection electrode, the second connection electrode being in contact with the third impurity region, wherein the oxide semiconductor layer comprises:

a first region;

a second region in contact with the second conductive layer;

a third region in contact with the third conductive layer;

a first impurity region between the first region and the second region, the first impurity region being in contact with the second conductive layer; and a second impurity region between the first region and the third region, the second impurity region being in contact with the third conductive layer, and an electrical conductivity of each of the first impurity region and the second impurity region is greater than an electrical conductivity of each of the second region and the third region.

2. The semiconductor device according to claim 1, wherein an impurity element contained in each of the first impurity region and the second impurity region is one selected from boron, phosphorus, argon, and nitrogen.

3. The semiconductor device according to claim 1, wherein an impurity element contained in each of the first impurity region, the second impurity region, and the third impurity region is one selected from boron, phosphorus, argon, and nitrogen.

4. The semiconductor device according to claim 3, wherein a concentration of the impurity element in at least one of the first impurity region, the second impurity region, and the third impurity region is greater than or equal to $1.0\times10^{16}$ atoms/$cm^3$.

5. The semiconductor device according to claim 1, wherein the first connection electrode is a same layer as the first conductive layer.

6. The semiconductor device according to claim 1, wherein the second connection electrode is a same layer as the second conductive layer and the third conductive layer.

7. A semiconductor device comprising:

a first conductive layer on an insulating surface;

a first insulating layer on the first conductive layer;

an oxide semiconductor layer on the first insulating layer;

a second insulating layer on the oxide semiconductor layer;

a second conductive layer on the second insulating layer;

a third conductive layer on the second insulating layer;

a first connection electrode on the insulating surface, the first connection electrode comprising a third impurity region; and a second connection electrode on the first connection electrode, the second connection electrode being in contact with the third impurity region, wherein the oxide semiconductor layer comprises:

a first region in contact with the second insulating layer;

a second region in contact with the second insulating layer and overlapping the second conductive layer;

a third region in contact with the second insulating layer and overlapping the third conductive layer;

a first impurity region between the first region and the second region, the first impurity region being in contact with the second conductive layer; and a second impurity region between the first region and the third region, the second impurity region being in contact with the third conductive layer, and an electrical conductivity of each of the first impurity region and the second impurity region is greater than an electrical conductivity of each of the second region and the third region.

8. The semiconductor device according to claim 7, wherein an impurity element contained in each of the first impurity region and the second impurity region is one selected from boron, phosphorus, argon, and nitrogen.

9. The semiconductor device according to claim 7, wherein an impurity element contained in each of the first impurity region, the second impurity region, and the third impurity region is one selected from boron, phosphorus, argon, and nitrogen.

10. The semiconductor device according to claim 9, wherein a concentration of the impurity element in at least one of the first impurity region, the second impurity region, and the third impurity region is greater than or equal to $1.0\times10^{16}$ atoms/$cm^3$.

11. The semiconductor device according to claim 7, wherein the first connection electrode is a same layer as the first conductive layer.

12. The semiconductor device according to claim 7, wherein the second connection electrode is a same layer as the second conductive layer and the third conductive layer.

* * * * *